(12) United States Patent
Spiro et al.

(10) Patent No.: US 10,628,751 B2
(45) Date of Patent: Apr. 21, 2020

(54) PROCESSING SENSOR LOGS

(71) Applicant: Palantir Technologies Inc., Palo Alto, CA (US)

(72) Inventors: Ezra Spiro, New York, NY (US); Andre Frederico Cavalheiro Menck, New York, NY (US); Peter Maag, Brooklyn, NY (US); Thomas Powell, London (GB)

(73) Assignee: Palantir Technologies Inc., Palo Alto, CA (US)

( * ) Notice: Subject to any disclaimer, the term of this patent is extended or adjusted under 35 U.S.C. 154(b) by 0 days.

(21) Appl. No.: 16/513,360

(22) Filed: Jul. 16, 2019

(65) Prior Publication Data

US 2019/0340531 A1    Nov. 7, 2019

Related U.S. Application Data

(63) Continuation of application No. 15/838,658, filed on Dec. 12, 2017, now Pat. No. 10,402,742.

(30) Foreign Application Priority Data

Dec. 16, 2016  (GB) ................................. 1621434.8
Feb. 8, 2017   (EP) ................................. 17155145

(51) Int. Cl.
*G01D 9/00*     (2006.01)
*G06F 17/00*    (2019.01)
(Continued)

(52) U.S. Cl.
CPC ............... *G06N 7/005* (2013.01); *G01D 9/00* (2013.01); *G05B 23/0221* (2013.01);
(Continued)

(58) Field of Classification Search
CPC .... G06N 7/005; G06N 20/00; G05B 23/0221; G05B 23/0237; G06K 9/0055;
(Continued)

(56) References Cited

U.S. PATENT DOCUMENTS 9,244,887 B2 *   1/2016  Leonard ................... G06F 17/18
2004/0113062 A1 * 6/2004  Norton ................ G01N 30/8624
                                                          250/282

(Continued)

OTHER PUBLICATIONS

Yi et al. Efficient Retrieval of Similar Time Sequences Under Time Warping (Year: 1998).*

(Continued)

*Primary Examiner* — Mohammad K Islam
(74) *Attorney, Agent, or Firm* — Sheppard Mullin Richter & Hampton LLP

(57) ABSTRACT

A method of processing sensor logs is described. The method includes accessing a first sensor log and a corresponding first reference log. Each of the first sensor log and the first reference log includes a series of measured values of a parameter according to a first time series. The method also includes accessing a second sensor log and a corresponding second reference log. Each of the second sensor log and the second reference log includes a series of measured values of a parameter according to a second time series. The method also includes dynamically time warping the first reference log and/or and second reference log by a first transformation between the first time series and a common time-frame and/or a second transformation between the second time series and the common time-frame. The method also includes generating first and second warped sensor logs by applying the or each transformation to the corresponding ones of the first and second sensor logs.

17 Claims, 14 Drawing Sheets

(51) Int. Cl.
*G06N 7/00* (2006.01)
*G06N 20/00* (2019.01)
*G06F 16/901* (2019.01)
*G05B 23/02* (2006.01)
*G06K 9/00* (2006.01)
*G06K 9/62* (2006.01)
*G06F 17/50* (2006.01)

(52) U.S. Cl.
CPC ....... *G05B 23/0237* (2013.01); *G06F 16/901* (2019.01); *G06F 17/5009* (2013.01); *G06K 9/00* (2013.01); *G06K 9/0055* (2013.01); *G06K 9/6253* (2013.01); *G06N 20/00* (2019.01)

(58) Field of Classification Search
CPC . G06K 9/6253; G06F 16/901; G06F 17/5009; G01D 9/00
See application file for complete search history.

(56) References Cited

U.S. PATENT DOCUMENTS

| | | | | |
|---|---|---|---|---|
| 2005/0207538 A1* | 9/2005 | Mollus | ............... | A61B 6/541 378/132 |
| 2010/0036791 A1* | 2/2010 | Kataoka | ........... | G01N 27/44717 706/52 |
| 2010/0183280 A1* | 7/2010 | Beauregard | .......... | G11B 27/034 386/285 |
| 2011/0035188 A1* | 2/2011 | Martinez-Heras | ... | G05B 23/021 702/189 |
| 2011/0268279 A1* | 11/2011 | Ishikawa | ............... | G10L 19/008 381/22 |
| 2011/0282828 A1* | 11/2011 | Precup | ............... | G06K 9/00348 706/54 |
| 2011/0288660 A1* | 11/2011 | Wojsznis | ........ | G05B 19/41875 700/30 |
| 2012/0059654 A1* | 3/2012 | Nishimura | ............. | G10L 13/02 704/243 |
| 2013/0138388 A1* | 5/2013 | Jain | ........................ | G01P 15/00 702/141 |
| 2013/0246026 A1* | 9/2013 | Ceglia | ................. | G05B 23/0216 703/6 |
| 2013/0278605 A1* | 10/2013 | Pathak | ............... | G05B 23/0267 345/440 |
| 2014/0049543 A1* | 2/2014 | Joshi | .................. | G05B 23/0272 345/427 |
| 2014/0122800 A1* | 5/2014 | Williams | ........... | G05B 23/0221 711/117 |
| 2014/0188770 A1* | 7/2014 | Agrafioti | ................ | A61B 5/117 706/13 |
| 2014/0336791 A1* | 11/2014 | Asenjo | ................. | G05B 13/026 700/44 |
| 2015/0261936 A1* | 9/2015 | Zhou | .................. | A61B 5/04012 705/3 |
| 2015/0277399 A1* | 10/2015 | Maturana | .............. | G06F 9/5072 700/29 |
| 2015/0382198 A1* | 12/2015 | Kashef | .................... | H04L 63/08 726/5 |
| 2016/0282947 A1* | 9/2016 | Schwarz | ................. | G06F 1/163 |
| 2016/0333673 A1* | 11/2016 | Anno | ..................... | G05B 15/02 |
| 2016/0334542 A1* | 11/2016 | Chiu | ........................ | G04G 7/00 |
| 2017/0003352 A1* | 1/2017 | Barre | ...................... | B60L 58/16 |
| 2017/0047186 A1* | 2/2017 | Chen | .................. | H01H 11/0062 |
| 2017/0117006 A1* | 4/2017 | Beerends | ................ | G10L 25/69 |
| 2017/0155885 A1* | 6/2017 | Selstad | ................ | H04N 13/344 |
| 2017/0176189 A1* | 6/2017 | D'Aquila | ............... | G01C 21/12 |
| 2017/0231519 A1* | 8/2017 | Westover | ............. | A61B 5/0476 600/544 |
| 2017/0299624 A1* | 10/2017 | Jain | ......................... | G01P 15/00 |
| 2018/0083982 A1* | 3/2018 | Asenjo | ................ | H04L 63/0428 |
| 2018/0146189 A1* | 5/2018 | Park | ...................... | G02B 27/017 |
| 2018/0150547 A1* | 5/2018 | Pallath | ................... | G06N 20/00 |
| 2018/0239955 A1* | 8/2018 | Rodriguez | ........... | G06K 9/0061 |

OTHER PUBLICATIONS

Mueen, Extracting Optimal Performance from Dynamic Time Warping (Year: 2016).*

* cited by examiner

PROCESSING SENSOR LOGS

CROSS REFERENCE TO RELATED APPLICATIONS

The present application is a continuation of U.S. patent application Ser. No. 15/838,658, filed Dec. 12, 2017, the contents of which are incorporated herein by reference in their entireties in the present disclosure.

FIELD OF THE DISCLOSURE

The present disclosure relates to a method and systems for processing sensor logs. In particular, although not exclusively, the present disclosure relates to processing sensor logs from machines in order to extract baseline values of parameters.

BACKGROUND

Machines are increasingly being fitted with sensors to record and control the functions of the machine and sub-systems of the machine. For example, a diesel engine for non-road mobile machinery such as, for example, a bull-dozer, tractor, digger and so forth may include sensors which measure, amongst other variables, injected fuel pressure, mass-flow of air into the engine, engine temperature, oxygen concentration in the outlet gases and so forth, to allow precise adjustments of the fuel/air mix. Similarly, a ship may typically include hundreds, thousands, or tens of thousands of sensors measuring parameters such as speed, fuel temperature, stresses in the propeller shafts and so forth. Many ships are powered by marine diesel engines, liquefied natural gas (LNG) engines or combi-fuel engines which may be powered using diesel or LNG. Some ships may include gas-turbine engines. Regardless of the particular type of engine, ship engines similarly include large numbers of sensors for operational, monitoring and diagnostic purposes.

Often, sensors fitted to a machine are linked to local electronic processors which control a local process and/or provide a warning or fault message when a parameter measured by a sensor moves outside of a predefined range. Such controls and monitoring are based on a local view or on assumptions about the behaviour of a subsystem and interrelated sub-systems of a machine.

SUMMARY

According to an embodiment of the specification there is provided a method of processing sensor logs, wherein the method is performed using one or more processors or dedicated hardware. The method includes accessing a first sensor log and a corresponding first reference log. Each of the first sensor log and the first reference log includes a series of measured values of a parameter according to a first time series. The method also includes accessing a second sensor log and a corresponding second reference log. Each of the second sensor log and the second reference log includes a series of measured values of a parameter according to a second time series. The method also includes dynamically time warping the first reference log and/or and second reference log by a first transformation between the first time series and a common time-frame and/or a second transformation between the second time series and the common time-frame. The method also includes generating first and second warped sensor logs by applying the or each transformation to the corresponding ones of the first and second sensor logs.

Dynamically time warping the first and second reference logs may include dividing the first time series into a plurality of sub-periods in dependence upon the first reference log, and dividing the second time series into a plurality of sub-periods in dependence upon the second reference log.

The first time series and the second time series may be divided into an equal number of sub-periods.

Each sub-period may have a type determined in dependence upon the corresponding first or second reference log.

Dynamically time warping the first and second reference logs may include, for each of the first and second reference logs, aggregating sub-periods of the same type, arranging aggregated sub-periods in dependence upon sub-period type, and setting each type of sub-period to correspond to an interval of the common time-frame.

Aggregating sub-periods of the same type may include arranging the sub-periods of that type consecutively.

Aggregating sub-periods of the same type may include setting each sub-period of that type to correspond to the same interval of the common time-frame, and calculating, based on the sub-periods of the same type, a single value for each time within the interval of the common time-frame.

The method may also include accessing a plurality of sensor logs and a corresponding plurality of reference logs, each sensor log and reference log comprising a series of measured values of a parameter according to a time series, each sensor log corresponding to a sensor type, transforming the plurality of sensor logs to a single, common time-frame by dynamic time warping and, for each sensor type, providing a baseline sensor log by determining and storing a series of averaged values according to a common time series spanning the common time-frame.

According to an embodiment of the specification there is provided a computer program, optionally stored on a non-transitory computer-readable medium, which, when executed by one or more processor of a data processing apparatus, causes the data processing apparatus to carry out the method.

According to an embodiment of the specification there is provided apparatus for processing sensor logs, the apparatus comprising one or more processors or dedicated hardware configured to access a first sensor log and a corresponding first reference log, each of the first sensor log and the first reference log comprising a series of measured values of a parameter according to a first time series, and access a second sensor log and a corresponding second reference log, each of the second sensor log and the second reference log comprising a series of measured values of a parameter according to a second time series. The apparatus also includes a log warping module configured to dynamically time warp the first reference log and/or and second reference log by a first transformation between the first time series and a common time-frame and/or a second transformation between the second time series and the common time-frame, and generate first and second warped sensor logs by applying the or each transformation to the corresponding ones of the first and second sensor logs.

The apparatus may also include a sub-period recognition module configured to divide the first time series into a plurality of sub-periods in dependence upon the first reference log, to divide the second time series into a plurality of sub-periods in dependence upon the second reference log, and to output the sub-periods of the first and second time series to the log warping module. The log warping module may be configured to carry out dynamic time warping of the first and second reference logs based on the sub-periods of the first and second time series.

The sub-period recognition module may be configured to divide the first and second time series into equal numbers of sub-periods.

The sub-period recognition module may be configured to determine a type of each sub-period in dependence upon the corresponding first or second reference log.

The log warping module may be configured to carry out dynamic time warping for each of the first and second reference logs by aggregating sub-periods of the same type, arranging aggregated sub-periods in dependence upon sub-period type, and setting each type of sub-period to correspond to an interval of the common time-frame.

Aggregating sub-periods of the same type may include arranging the sub-periods of that type consecutively. Aggregating sub-periods of the same type may include setting each sub-period of that type to correspond to the same interval of the common time-frame, and calculating, based on the sub-periods of the same type, a single value for each time within the interval of the common time-frame.

A system may include one or more machines and the apparatus. Each machine may include one or more sensors, each sensor having a sensor type. Each machine may be configured to output sensor logs comprising one or more series of measured values according to a time series and reference logs comprising one or more series of measured values according to a time series. The apparatus may be configured to receive and process sensor logs and reference logs from the one or more machines.

DETAILED DESCRIPTION OF CERTAIN EMBODIMENTS

Figure 1:
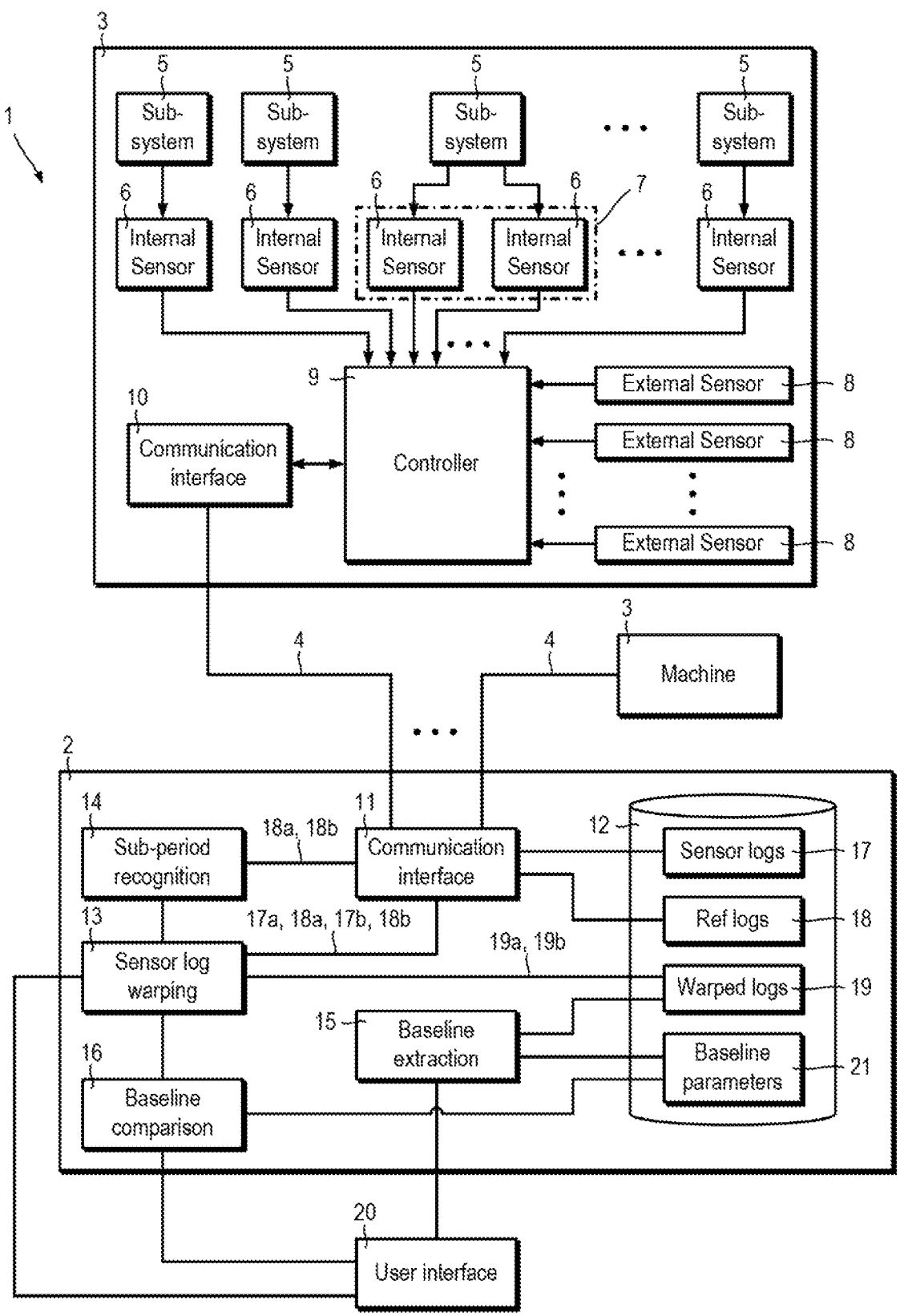
FIG. 1 is a block diagram of a system including an apparatus according to embodiments of this specification for processing sensor logs generated by a machine.

In brief, this specification describes processing of sensor logs, a sensor log being multiple measurements of parameters captured by one or more sensors and relating to different points in time (a time series). The parameters may be physical parameters.

In some embodiments, there are a first sensor log which corresponds to a first reference log, and a second sensor log which corresponds to a second reference log. The first and second reference logs (and the first and second sensor logs) relate to measurements from different machines of the same type, or from different operations of the same machine at different times (e.g., they relate to different time periods). The first and second reference logs' measurements relate to a parameter which is relatively well understood as regards operation of the machine. The first and second sensor logs' measurements relate to a different parameter, which is less well understood as regards operation of the machine. The parameters may be physical parameters.

The first reference log and/or the second reference log are dynamically time warped to a common time reference so that sections of the first reference log are aligned with corresponding sections of the second reference log. The dynamic time warping thus provides a transformation. The transformation is of either or both of the first reference log and the second reference log, to achieve the dynamic time warping. The first sensor log and/or the second sensor log is then dynamically time warped by the same transformation applied to the first reference log and/or the second reference log. The result of this is that sections of the first sensor log are aligned with corresponding sections of the second sensor log. This allows comparison of the corresponding sections of the first sensor log with the second sensor log, and thus allows differences and similarities between the measurements of the less well understood parameter to be assessed.

This can be useful in a number of different situations. First, where the first sensor log corresponds relatively closely to the second sensor log and where the machine (or time period) from which the first sensor log was derived continued to operate without fault for a period of time after the time to which the first sensor log relates, then the machine (or time period) from which the second sensor log was derived might be determined to be a machine that is relatively unlikely to develop a fault in the near future. Secondly, where the first sensor log corresponds relatively closely to the second sensor log and the machine (or time period) from which the first sensor log was derived developed a fault within a period of time after the time to which the first sensor log relates, then the machine from which the second sensor log was derived might be determined to be a machine that is relatively likely to develop the same fault.

Third, where the first sensor log does not correspond relatively closely to the second sensor log and where the machine (or time period) from which the first sensor log was derived continued to operate without fault for a period of time after the time to which the first sensor log relates or was otherwise judged to be properly functioning, then the machine from which the second sensor log was derived might be identified as relatively likely to develop a fault.

Identifying that a fault is relatively likely to occur, and identifying the potentially upcoming fault, is particularly useful with machines such as ship subsystems where there are safety implications and where faulty machines cannot necessarily be shutdown or removed from service immediately. It can also be potentially useful with non-road mobile machines, to identify developing faults and/or anomalous performance. The present specification can be applied to many other vehicular machines such as, for example, trains, trams, and so forth. The present specification can also be applied to manufacturing or refining plant machinery, energy generation systems or any other machine which includes sensors.

Providing information about the technical operation of a machine and/or the likelihood of a fault occurring allows the machine to be maintained such as to operate in a technically improved way, with fewer faults occurring.

A sensor log and a corresponding reference log may be a baseline sensor log and baseline reference log respectively. A baseline log is one which is derived from multiple sensor logs and which can thus be indicative of normal machine behaviour and normal machine operation. Baseline sensor logs and baseline reference logs can allow anomalies in other sensor logs to be identified, thereby allowing abnormal operation to be identified and/or allowing faults to be predicted.

Embodied systems and methods can be suitable for detecting and/or analysing unexpected or unpredictable behaviours which arise due to interactions between multiple interrelated subsystems or parts of a machine.

For machines which operate regularly and continuously, it may be relatively simple to determine the "normal", or baseline values of measured parameters, for example, the temperature of a furnace which is continuously operated. However, for other types of machines, including many vehicles or plant machinery used in batch or one-off manufacturing, naïve baseline determination by taking a simple average over a time-series of measured parameter values is likely to be of limited value. Using the methods and systems of the embodiments, though, can allow normal machine operation, and deviation from normal operation, to be detected for very complex machines having highly irregular operation profiles.

Reference will now be made to certain examples which are illustrated in the accompanying drawings. Whenever possible, the same reference numbers will be used throughout the drawings to refer to the same or like parts.

Referring to FIG. 1, a system 1 includes an apparatus 2 for processing sensor logs in communication with one or more machines 3 through network links 4.

The machines 3 each include a number of sub-systems 5. Each sub-system 5 may include one or more internal sensors 6 which are arranged to record parameter values relating to the internal state of the machine 3 and/or the corresponding sub-system 5. Two or more internal sensors 6 associated with the same sub-system 5 form a sensor group 7. Each machine 3 may also include a number of external sensors 8 which are arranged to record parameter values relating to a non-internal state of the machine 3. A controller 9 receives measured parameters from the internal sensors 6 and external sensors 8 and transmits them to the apparatus 2 for processing sensor logs via a communication interface 10. Machines 3 may be any type of machine capable of capturing sensor data such as, for example, ships, non-road mobile machines, manufacturing plant, refining plant and so forth. Machines 3 may be self-contained machines, or each machine 3 may form a part or system of a larger whole. One or more machines may be interrelated in their structure and/or function.

The sub-systems 5 included in a machine 3, and the sensors 6 associated with them, depend on the type of machine. Each sub-system 5 may be a mechanical system, an electrical system, a computer system or a combination thereof. For example, a non-road mobile machine 24 (FIG. 3) may include sub-systems 5 such as, for example, engine monitoring, traction control, hydraulic/pneumatic system control, exhaust, power steering and so forth. As another example, a ship 22 (FIG. 2) may include sub-systems 5 such as, for example, a navigational computer system, a crew and/or cargo environmental control and monitoring system, a fuel management system, an engine management system, a fire suppression system, a bilge system and so forth.

Sensors 6, 8 provide output in the form of time series of measured parameter values. A time series of measured parameter values is in the form of a list of measured values and corresponding times. Two or more measured values may correspond to each time in the time series, or put another way there may be two or more measurements for each point in the time series. Sensors 6, 8 may measure parameter values according to a regular schedule. Sensors 6, 8 may measure parameter values in response to a condition such as, for example, the output value of another sensor 6, 8 or a command from the controller 9.

Examples of internal sensors 6 include, but are not limited to, temperature sensors, pressure sensors, electrical current or voltage sensors, gas concentration sensors, strain gauges and so forth. Examples of external sensors include, but are not limited to speed sensors, acceleration sensors, magnetic field sensors, position sensors such as a global positioning system (GPS), ambient temperature sensors, ambient pressure sensors, ambient humidity sensors and so forth. Division between internal and external sensors 6, 8 is not always clear cut, and some sensors may relate to both internal and external states of a machine 3. In general, internal and external sensors 6, 8 may be provided by the same or similar sensor hardware. For example, wheel rotation speed sensors in a non-road mobile machine 24 may be used to determine the external parameter of speed and may also be used to determine internal parameters relating to traction of individual wheels.

Data from sensors 6, 8 may be stored in the machine 3 for later transmission or download to the apparatus 2. Alternatively, data from sensors 6, 8 may be transmitted to the apparatus 2 continuously or according to a schedule.

Apparatus 2 for processing sensor logs includes a communication interface 11, a database 12, a sensor log warping module 13, a sub-period recognition module 14, a baseline extraction module 15 and a baseline comparison module 16.

The communication interface 11 is configured to receive sensor logs and reference logs 17, 18 from the machine(s) 3. The sensor logs 17 and reference logs 18 take the form of time series of measured parameter values. Sensor logs 17 and reference logs 18 are time series of values recorded by the sensors 6, 8 of a machine. The communication interface 11 is configured to differentiate between sensor logs 17 and between reference logs 18 based on the corresponding type of sensor 6, 8. The division between sensor logs 17 and reference logs 18 can be made in advance automatically or by an engineer configuring the apparatus 2, in dependence on the type of machine 3 and the available sensors 6, 8. The communication interface 11 provides the sensor logs 17 and reference logs 18 to the sensor log warping module 13.

The communication interface 11 passes the sensor logs 17 and/or reference logs 18 for storage in the database 12. The communication interface 11 may also access the database to retrieve previously stored sensor logs 17 and/or reference logs 18 which can be provided to the sensor log warping module 13.

Reference logs 18 typically correspond to those sensors 6, 8 which produce an output which relates to the task which a machine 3 is performing. Consequently, they may correspond to external sensors 8 measuring parameters such as, for example, speed, position, acceleration, power output and so forth. Additionally, reference logs 18 may also correspond to internal sensors 6, which record parameters which are relatively easy to interpret the meaning of, for example, the revolutions per minute of an internal combustion engine.

The sensor log warping module 13 can receive a pair of first and second sensor logs 17a, 17b and corresponding first and second reference logs 18a, 18b. The first and second sensor logs 17a, 17b correspond to the same sensor type or types, but correspond to different machines 3 or to different operations of the same machine 3. The first sensor log 17a and the first reference log 18a take the form of a series of measured values according to a first time series. The second sensor log 17b and the second reference log 18b take the form of a series of measured values according to a second time series. The first and second time series do not need to cover the same interval, and in general do not. For example, the first sensor log 17a and the first reference log 18a may include measured parameter values corresponding to a first number, N, of time points $t^a_1, t^a_2, \ldots, t^a_n, t^a_N$ and the second sensor log 17b and the second reference log 18b may include measured parameter values corresponding to a second number, M, of time points $t^b_1, t^b_2, \ldots t^b_m, t^b_M$. Although the first and second numbers N, M may be equal, in general N≠M. The spacing of measurements need not be the same for the first and second logs, for example $t^a_2 - t^a_1 \neq t^b_2 - t^b_1$.

The sensor log warping module 13 applies a dynamic time warping algorithm to the first and second reference logs 18a, 18b to transform them both to a common time-frame. Based on the dynamic time warping of the first and second reference logs 18a, 18b, the sensor log warping module 13 determines a first transformation $T_a$ between the first time series running between $t^a_1$ and $t^a_N$ and a warped time series spanning the common time-frame between a start time $t_{start}$ and an end time $t_{end}$. For example, the first transformation may be a one-to-one mapping function $T_a(t)$ mapping the first time series $t^a_1, t^a_2, \ldots, t^a_n, \ldots, t^a_N$ to a warped time series in the common time-frame $T_a(t^a_1), T_a(t^a_2), \ldots, T_a(t^a_n), \ldots, T_a(t^a_N)$ in which $t_{start} = T_a(t^a_1)$ and $t_{end} = T_a(t^a_N)$. Alternatively, the first transformation $T_a$ may be a many-to-one transformation which maps two or more points of the first time series to a single point within the common time-frame. The first transformation $T_a$ may be a continuous function or a discontinuous function. In the same way, the sensor log warping module 13 determines a second transformation $T_b$ between the second time series running between $t^b_1$ and $t^b_M$ and a warped time series spanning the common time-frame. The sensor log warping module 13 applies the first transformation $T_a$ to the first sensor log 17a to obtain a first warped sensor log 19a, and applies the second transformation $T_b$ to the second sensor log 17b to obtain a second warped sensor log 19b. The first and second warped sensor logs 19a, 19b may be stored to the database 12 and/or displayed via a user interface 20.

The sub-period recognition module 14 is configured to divide the first time series into a plurality of sub-periods in dependence upon the first reference log, and to divide the second time series into a plurality of sub-periods in dependence upon the second reference log. Each sub-period takes the form of a portion of the first or second time series, for example, a sub-period of the first time series may be $t^a_{14}, t^a_{15}, \ldots t^a_{32}, t^a_{33}$. The sub-periods of the first time series are consecutive and non-overlapping. The sub-periods of the second time series are also consecutive and non-overlapping. The division into sub-periods is performed based on feature recognition using the first and second reference logs 18a, 18b. Sub-periods may be defined based on the values of the first and second reference logs 18a, 18b and/or using first, second or subsequent derivatives of the values of the first and second reference logs 18a, 18b.

For example, sub-periods may be defined based on the values of the first and second reference logs 18a, 18b (and/or derivatives thereof) falling within one or more ranges.

The sensor log warping module 13 may receive the sub-periods defined for the first and second time series $t^a_1, t^a_2, \ldots, t^a_n, \ldots, t^a_N$ and $t^b_1, t^b_2, \ldots t^b_m, \ldots, t^b_M$, and may use the sub-period definitions in determining the first and second transformations $T_a$, $T_b$. In some examples, the sub-period recognition module 14 may also determine a type for each sub-period in dependence upon the measured values of the first and second reference logs 18a, 18b. In such examples, the second log warping module may also use the sub-period types when determining the first and second transformations $T_a$, $T_b$.

The first and second sensor logs 17a, 17b and corresponding reference logs 18a, 18b may both be received by the communications interface 11 and routed directly to the sensor log warping module 13. In other examples, one or both of the first and second sensor logs 17a, 17b and corresponding reference logs 18a, 18b may be retrieved from the database 12 before processing by the sensor log warping module 13, for example in response to inputs received through the user interface 20.

Some examples of the apparatus 2 may include a baseline extraction module 15 configured to retrieve a set of warped sensor logs 19 and to determine baseline parameters 21 corresponding to that set of warped sensor logs 19. All the warped sensor logs 19 processed by the baseline extraction module 15 have been transformed to span the same common time-frame. Sensor logs 17 received from machines 3 may be compared against baseline parameters 21 for the corresponding sensor types by the baseline comparison module 16. An operator, for example an engineer or mechanic, may view the baseline parameters 21 and any deviations of one or more sensor logs 17 from the baseline parameters 21 using a user interface 20.

For example, the baseline extraction module 15 may retrieve all warped sensor logs corresponding to a temperature sensor 6 which is part of one or more machines, then process the warped sensor logs to determine, for each point of the common time frame, a mean and standard deviation of the temperature. In this way, a baseline value and typical variability for the temperature sensor 6 may be determined. During subsequent operations of the machine 3, the temperature values measured by the sensor 6 of a machine 3 may be compared to the calculated baseline values by the baseline comparison module 16. Any deviation of the values from the mean temperature may be compared with the standard deviation of the temperature (or a multiple thereof) in order to identify outlying values.

One or all of the sensor log warping module 13, sub-period recognition module 14, baseline extraction module 15 and baseline comparison module 16 may be provided by dedicated hardware such as, for example, an application specific integrated circuit or field programmable gate array. Alternatively, one or all of the sensor log warping module 13, sub-period recognition module 14, baseline extraction module 15 and baseline comparison module 16 may be provided by software executed by one or more processors (each comprising processor circuitry) of a data processing apparatus. The database 12 may be provided by any suitable, high capacity non-volatile storage device. The communication interface 11 may be a modem, a bus controller or other communication device compatible with transferring information over network links 4. Further features of the apparatus 2 shall be apparent from the description which follows.

Network links 4 may be provided by local networks or via a public network such as the Internet. Network links 4 may be wired or wireless. Network links 4 may be permanent or temporary. In some examples, network links 4 may be established by connecting the apparatus 2 to the machine(s) 3 using a cable and port such as a universal serial bus configuration. Network links 4 are not essential, and in some examples the sensor logs 17 and reference logs 18 may be transferred from the machine 3 to a portable storage device. The portable storage device may subsequently be connected to the apparatus 2 either directly or via a network to enable the sensor logs 17 and reference logs 18 to be transferred to the apparatus 2.

Figure 2:
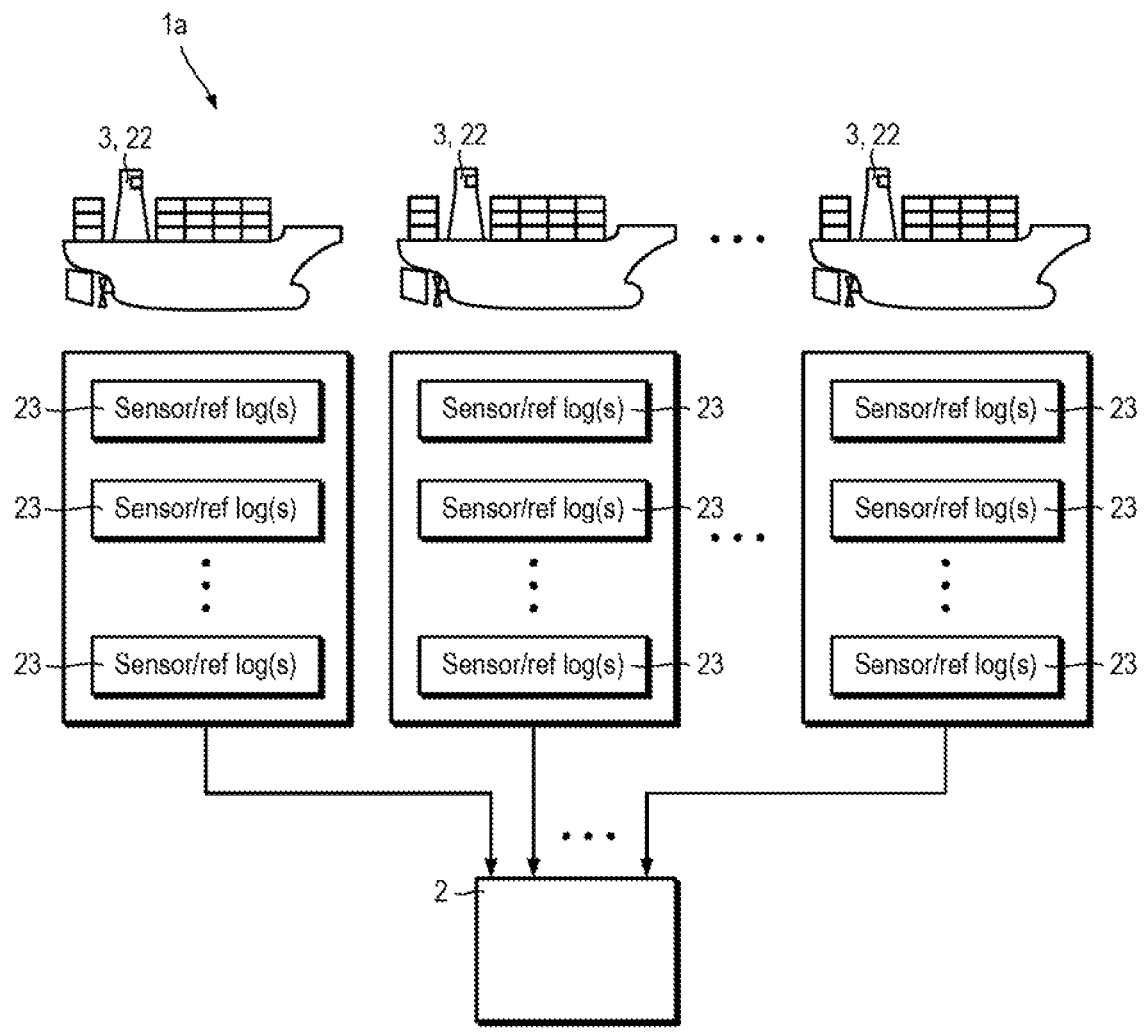
FIG. 2 illustrates an apparatus according to embodiments of this specification for processing sensor logs receiving sensor logs from a number of machines in the form of ships.

Referring also to FIG. 2, in an example system 1a, sensor 6, 8 data from a number of machines 3 in the form of ships 22 are collected, stored and processed by the apparatus 2. The ships 22 may be, for example, passenger cruise ships, car transporter ferries, cargo ships, tanker ships, tugs and so forth. Ships 22 conduct voyages, the duration of which may vary considerably depending upon the type of ship 22. In one example, a ship 22 may be a passenger or vehicle ferry which carries out regular, scheduled voyages between two or more relatively close ports/docks such as, for example, Dover and Calais, Dublin and Liverpool and so forth. In this example, the duration of a voyage may range from less than an hour up to several days. In other examples, a ship 22 may be a long distance cargo ship or tanker, and the duration of a voyage may be weeks or months.

The apparatus 2 may receive, store and process a plurality of datasets 23 corresponding to each ship 22. Each dataset 23 includes sensor logs 17 and reference logs 18 corresponding to a voyage conducted by the ship 22, or a period during a voyage such as, for example, a day. When the system 1a is setup, the database 12 of the apparatus 2 may be populated by providing a plurality of historic datasets 23 for each ship 22 to the apparatus 2. The sensor logs 17 and reference logs 18 may be stored to the database 12 and processed to generate the corresponding warped sensor logs 19. The baseline extraction module 15 may process the plurality of warped sensor logs 19 to determine baseline parameters 21, which are stored in the database 12.

After and/or during subsequent voyages of each ship 22, or periods thereof, the new dataset 23 corresponding to the voyage or period may be provided to the apparatus 2. The new dataset may be processed to generate warped sensor logs 19, which are analysed with reference to the baseline parameters 21 by the baseline comparison module 16. In this way, any abnormal sensor data (e.g., received from sensors 6, 8) may be detected. Abnormal sensor data can indicate that a problem or fault is developing in the ship 22 or a subsystem 5 of the ship 22.

Figure 3:
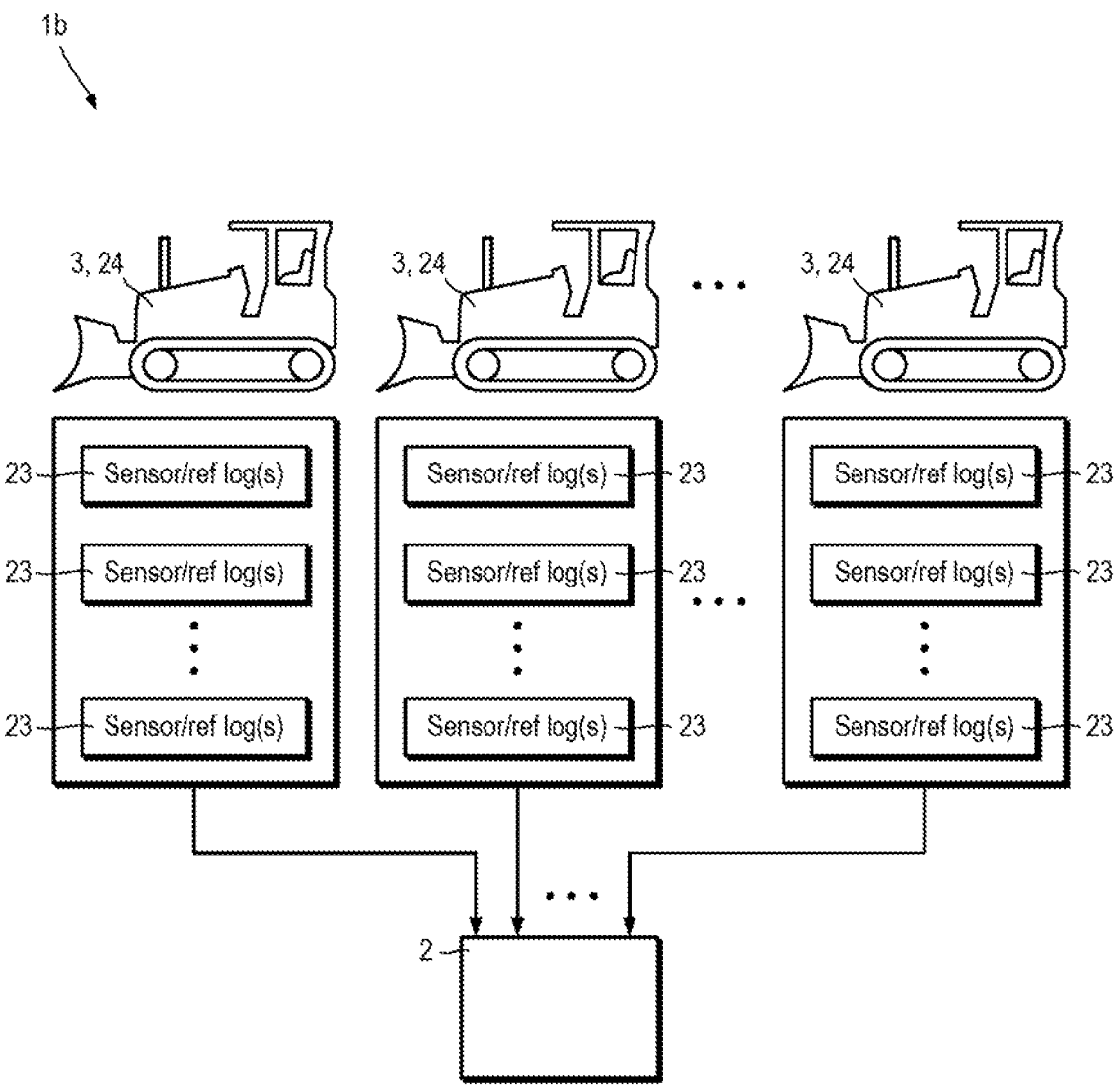
FIG. 3 illustrates an apparatus according to embodiments of this specification for processing sensor logs receiving sensor logs from a number of machines in the form of non-road mobile machines.

Referring also to FIG. 3, in another example system 1b, sensor 6, 8 data from a number of machines 3 in the form of non-road mobile machines 24 are collected, stored and processed by the apparatus 2. Non-road mobile machinery 24 may include vehicles such as, for example, bulldozers, diggers, cranes, tractors, combine harvesters and so forth.

The apparatus 2 may receive, store and process a plurality of datasets 23 corresponding to each non-road mobile machine 24. Each dataset 23 includes sensor logs 17 and reference logs 18 corresponding to, for example, a journey conducted by, or a working day of, a corresponding non-road mobile machine 24. Sensor logs 17 and reference logs 18 may correspond to any definable task performed by a non-road mobile machine 24, or any period over which a non-road mobile machine 24 operates. When the example system 1b is setup, the database 12 of the apparatus 2 may be populated by providing a plurality of historic datasets 23 for each non-road mobile machine 24 to the apparatus 2. The sensor logs 17 and reference logs 18 may be stored to the database 12 and processed to generate the corresponding warped sensor logs 19. The baseline extraction module 15 may process the plurality of warped sensor logs 19 to determine baseline parameters 21, which are stored in the database 12.

After and/or during subsequent journeys, tasks or working days of each non-road mobile machine 24, or periodically when the non-road mobile machine 24 is undergoing regular checks and/or maintenance, the new dataset or datasets 23 corresponding to subsequent journeys, tasks or working days may be provided to the apparatus 2. The new dataset(s) may be processed to generate warped sensor logs 19, which are analysed with reference to the baseline parameters 21 by the baseline comparison module 16. In this way, any abnormal sensor data (e.g., received from sensors 6, 8) may be detected. Abnormal sensor data can indicate that a problem or fault is developing in the non-road mobile machine 24.

It will be appreciated that the system 1 is not limited to ships 22 and/or non-road mobile machines 24, and is equally applicable to machines 3 in the form of any other type of vehicle such as, for example, trains, ships, tractors, construction machinery and so forth.

The system 1 is not limited to machines 3 in the form of vehicles, and may instead be used with any type of machine which includes sensors. For example, the present specification may be applied to manufacturing plant equipment or to chemical refinery equipment such as a petrochemical refinery plant. A further example of a machine 3 which can be used with the system 1 is tunnel boring equipment. Tunnel boring equipment is complex machinery which is operated in a range of different environments and under a range of mechanical loadings. Each location for tunnel boring will have a different geological constitution, so that loading of a boring bit will vary with depth in a different way at each boring location. The system 1 may equally be used with other machines 3 for quarrying and so forth.

The system 1 may also be used with machines 3 used for energy generation, and in particular with machines 3 for energy generation which experience variable environments and loadings such as, for example, onshore and/or offshore wind generators, tidal generators, marine current generators, wave power generators and so forth.

Machines 3 have been described which include a controller 9. However, machines 3 may have a more distributed architecture for collecting sensor 6, 8 data. For example, each sub-system 5 may include a controller, and the controllers of each sub-system 5 may be connected to a common bus which is connected to the communication interface 10.

Figure 4:
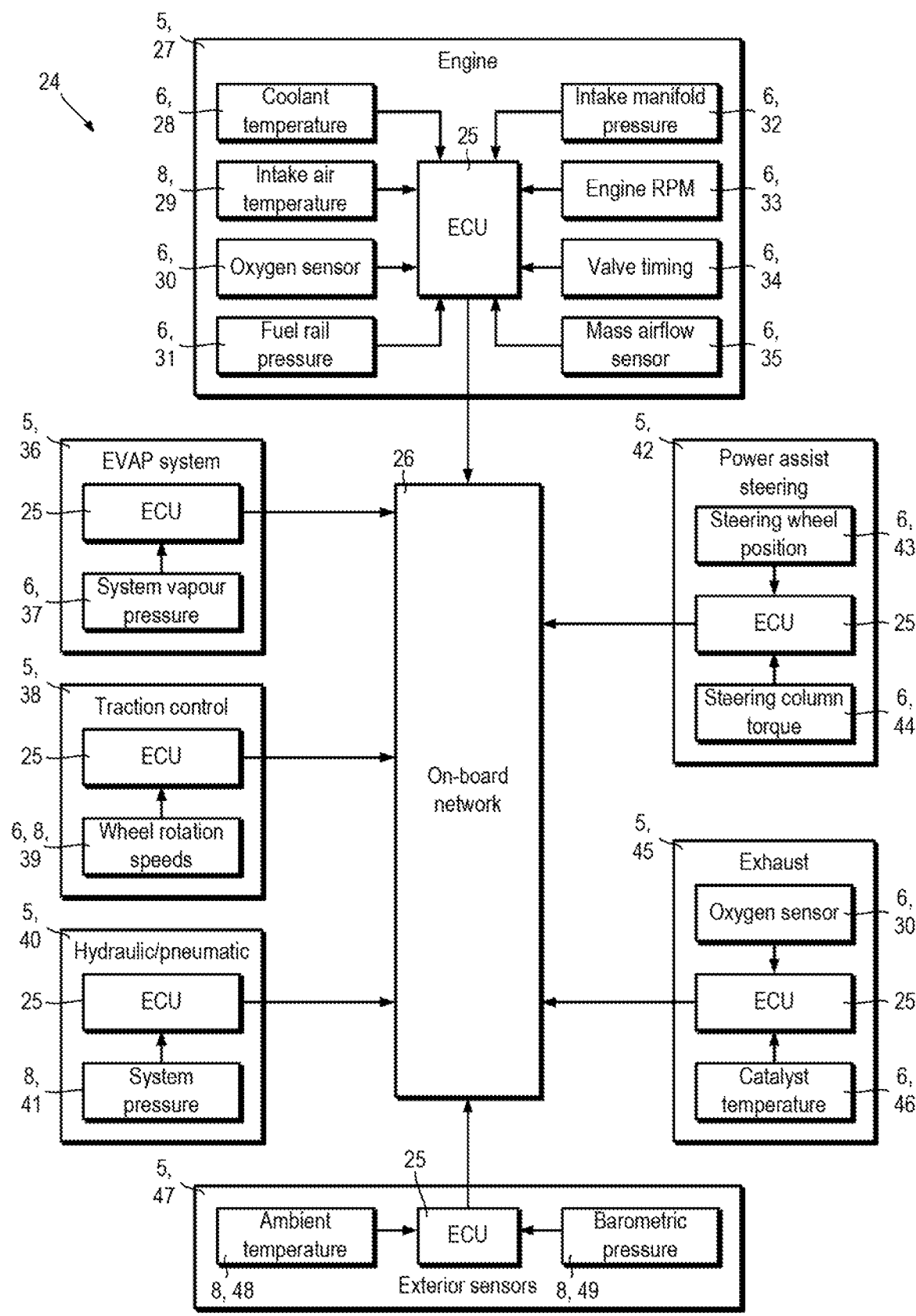
FIG. 4 is a block diagram illustrating sub-systems and sensors of a non-road mobile machine.

Referring also to FIG. 4, non-road mobile machines 24 can provide an example of a distributed architecture including multiple controllers. Non-road mobile machine 24 may be vehicles such as, for example, bulldozers, diggers, cranes, tractors, combine harvesters and so forth.

Many non-road mobile machines 24 include a number of sub-systems 5 which may be mechanical systems, electrical systems, computer systems or combinations thereof. Sub-systems 5 of a non-road mobile machine 24 may be controlled by one or more corresponding electronic control units 25 (ECUs), and the ECUs 25 of a non-road mobile machine 24 are interconnected for communications by an on-board network 26. Each sub-system 5 may include one or more sensors 6, 8 which monitor corresponding physical parameters of the sub-system 5. One or more sensors 6, 8 associated with a sub-system 5 form a sensor group 7. Data from sensors 6, 8 may be stored on the non-road mobile machine 24 and subsequently transmitted or downloaded from the non-road mobile machine 24 to the apparatus 2 according to a schedule, for example upon arrival to a designated "home" location, daily or weekly. Data from some sensors 6, 8 may be transmitted to the apparatus 2 via wireless networks operating at a storage location of a non-road mobile machine 24. Data from some sensors 6, 8 may be transmitted to the apparatus 2 via cellular networks during operation of a non-road mobile machine 24. Sub-systems 5 connected via the on-board network 26 typically generate messages according to standardised protocols. Information from a non-road mobile machine 24, for example sensor logs and/or reference logs 23, may be extracted via a wireless connection or using a physical data port (not shown) provided on the non-road mobile machine 24.

Many non-road mobile machines 24 include a diesel engine subsystem or subsystems 27, which may include a large number of sensors 6, 8 for use in regular operation, self-diagnostics, maintenance and/or repair. For example, a non-road mobile machine 24 engine 27 may include, amongst other sensors 6, 8, a coolant temperature sensor 28, an intake air temperature sensor 29, one or more oxygen sensors 30 to monitor combustion efficiency, a fuel rail pressure sensor 31, an intake manifold gas pressure sensor 32, and engine RPM sensor 33, one or more valve timing sensors 34, a mass airflow sensor 35 and so forth. Most of the engine 27 sensors are internal sensors 6, but several, for example the intake air temperature sensor 29 may be external sensors 8.

Non-road mobile machines 24 may include an evaporative emissions control system 36 (EVAP system) including an internal sensor 6 in the form of a vapour pressure sensor 37. Some non-road mobile machines 24 may include a traction control system 38 including sensors 6, 8 in the form of wheel rotation speed sensors 39. Wheel rotation speed sensors 39 may be used as external sensors 8 to determine a speed of the non-road mobile machine 24, in addition to being used as internal sensors 6 to detect a loss of traction by one or more wheels. Some non-road mobile machines 24 may include a hydraulic or pneumatic actuation system 40 including system pressure sensors 41, valve status sensors, load sensors and so forth, for controlling and monitoring actuation of tools such as a bull dozer scoop. Non-road mobile machines 24 may include a power assist steering system 42 including internal sensors 6 in the form of steering wheel position sensors 43 and steering column torque sensors 44. Non-road mobile machines 24 may include an exhaust system 45 including internal sensors 6 in the form of one or more oxygen concentration sensors 30 and one or more catalyst bed temperature sensors 46. Non-road mobile machines 24 may include exterior sensing systems 47 including external sensors 8 such as, for example, ambient temperature sensors 48 and ambient barometric pressure sensors 49 for determining the environmental conditions in which the non-road mobile machine 24 is operating.

A communications interface 11 can also be connected to the on-board network 26.

First Method

Figure 5:
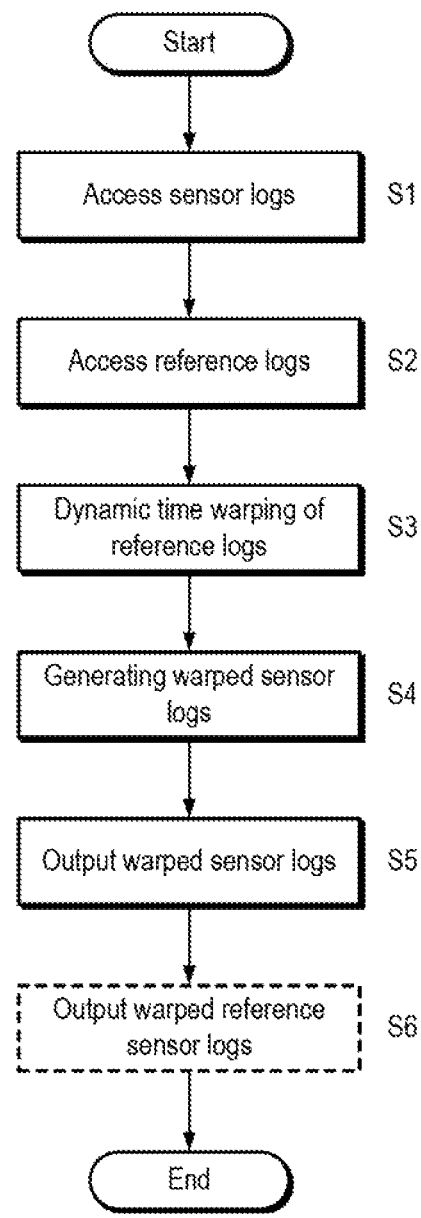
FIG. 5 is a process flow diagram of a first method of processing sensor logs according to embodiments of this specification.

Referring also to FIG. 5, a first method of processing sensor logs 17 is explained.

The sensor log warping module 13 accesses first and second sensor logs 17a, 17b via the communication interface 11 (step S1). The communication interface 11 may receive the first and second sensor logs 17a, 17b via network links 4. The communication interface 11 may retrieve one or both of the first and second sensor logs 17a, 17b from the database 12.

The sensor log warping module 13 accesses first and second reference logs 18a, 18b via communication interface 11 (step S2). The communication interface 11 may receive the first and second reference logs 18a, 18b via network links 4. The communication interface 11 may retrieve one or both of the first and second reference logs 18a, 18b from the database 12.

Figure 6:
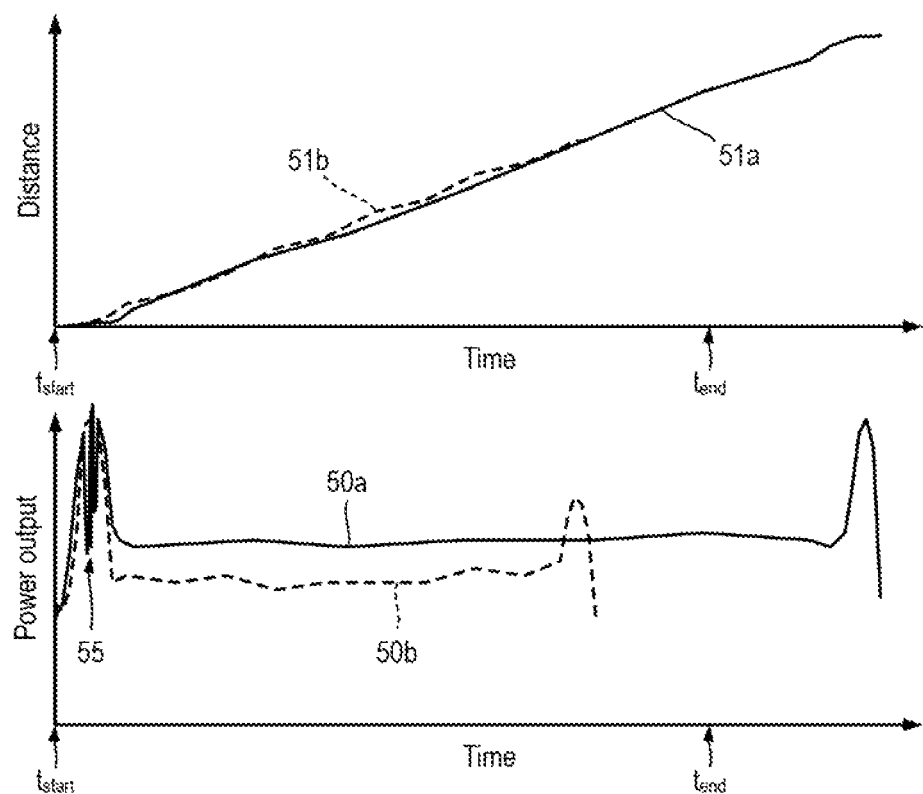
FIG. 6 illustrates examples of first and second sensor logs and first and second reference logs.

For example, referring also to FIG. 6, if the machine 3 is ship 22, the first and second sensor logs 17a, 17b may correspond to first and second power output profiles 50a, 50b for an engine, and the first and second reference logs 18a, 18b may correspond to first and second distance profiles 51a, 51b. The first and second power output profiles 50a, 50b and the first and second distance profiles 51a, 51b are illustrative only, and do not represent actual data of a ship or ships 22.

The sensor log warping module 13 applies a dynamic time warping algorithm to the first and second reference logs 51a, 51b to transform them both to a common time-frame (step S3). Based on the dynamic time warping of the first and second reference logs 51a, 51b, the sensor log warping module 13 determines a first transformation $T_a$ between the first time series running between $t^a_1$ and $t^a_N$ and a warped time series spanning the common time-frame between a start time $t_{start}$ and an end time $t_{end}$ (step S4). The common time-frame may be based on one of the first or second time series, such that one of the reference logs 51a, 51b is warped to match the other. Alternatively, the common time-frame may be set independently of either one of the first and second time series, such that both reference logs 51a, 51b are warped to conform to the common time-frame.

The first transformation may be a one-to-one mapping function $T^a(t)$ mapping the first time series $t^a_1, t^a_2, \ldots, t^a_n, \ldots, t^a_N$ to a warped time series in the common time-frame $T_a(ta1), T_a(t^a_2), \ldots, T_a(t^a_n), \ldots, T_a(t^a_N)$ in which $t_{start} = T_a(t^a_1)$ and $t_{end} = T_a(t^a_N)$. Alternatively, the first transformation $T_a$ may be a many-to-one transformation which maps two of more points of the first time series to a single point which the common time-frame. The first transformation $T_a$ may be a continuous function or a discontinuous function. The first transformation $T_a$ may be non-linear. As a result of the first transformation $T_a$, some parts of the first time series are expanded and other parts may be contracted. In the same way, the sensor log warping module 13 determines a second transformation $T_b$ between the second time series running between $t^b_1$ and $t^b_M$ and a warped time series spanning the common time-frame.

Figure 7:
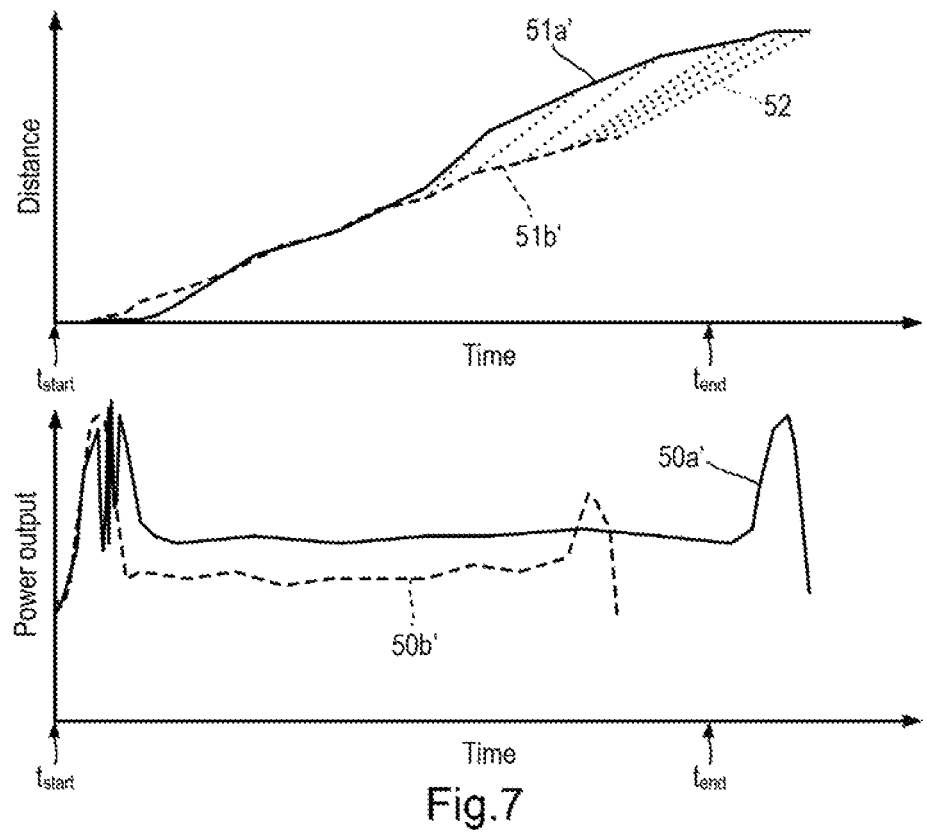
FIGS. 7 and 8 illustrate intermediate stages of processing the first and second sensor logs and first and second reference logs shown in FIG. 6 according to the first method.
Figure 8:
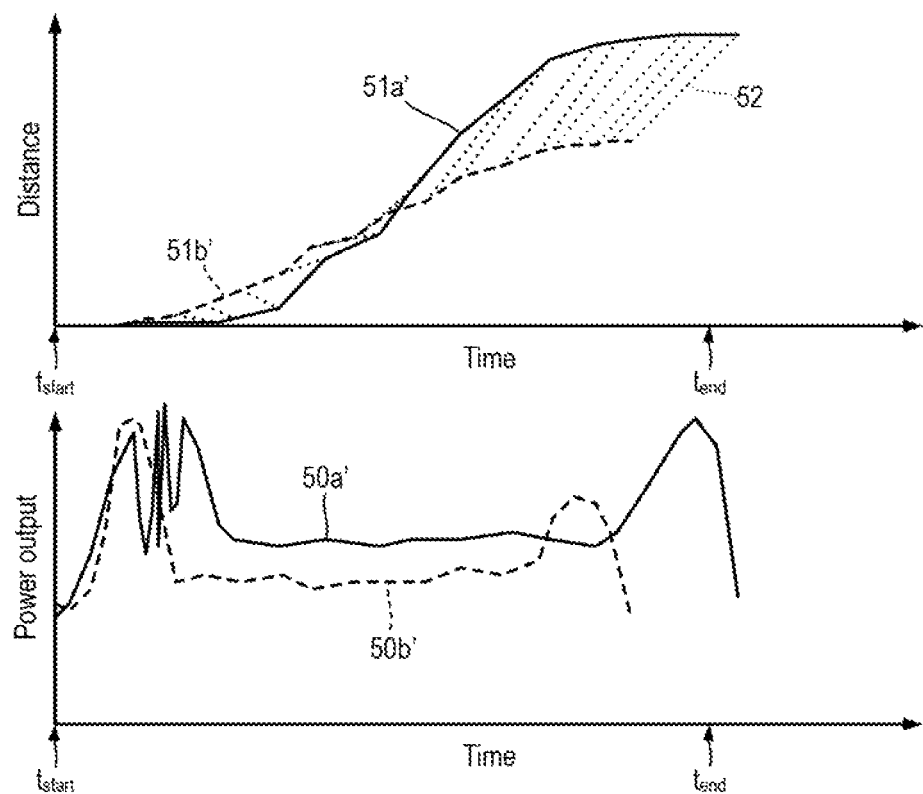
Figure 9:
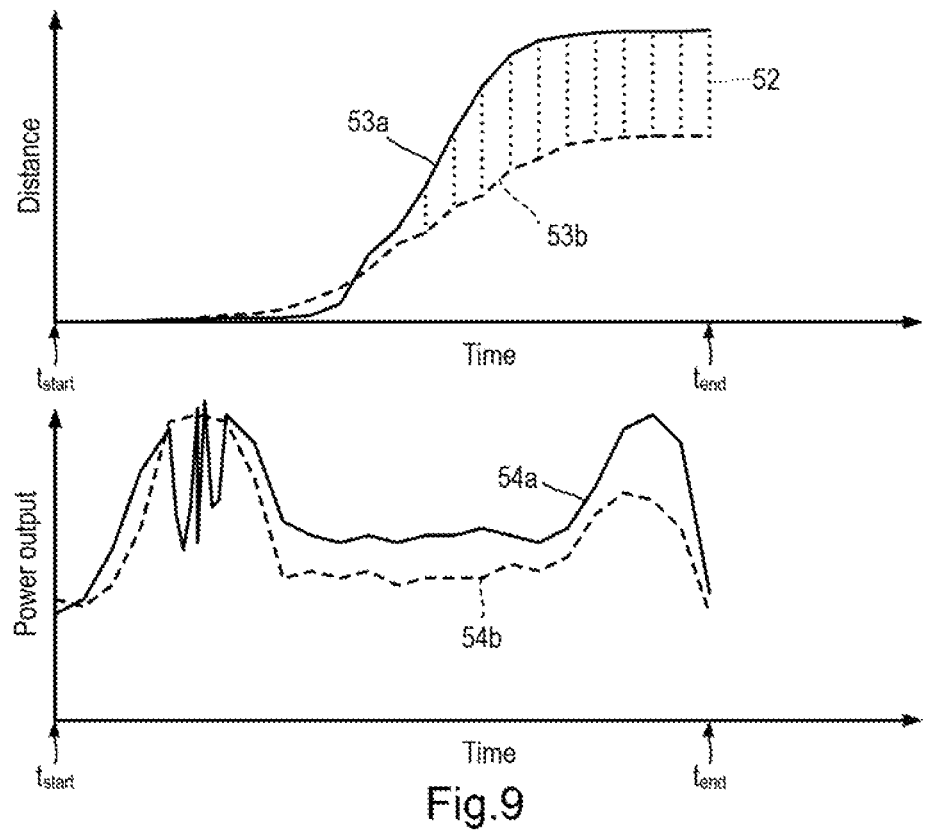
FIG. 9 illustrates the output of processing the first and second sensor logs and first and second reference logs shown in FIG. 6 according to the first method

For example, referring also to FIGS. 7 and 8, intermediate power output profiles 50a', 50b' and intermediate power output profiles 51a', 51b' are shown which correspond to intermediate stages of applying a dynamic time warping algorithm to the first and second distance profiles 51a, 51b. Visualisation guides 52 are provided to indicate relationships between certain points of the first and second reference distance profiles 51a, 51b (corresponding to first and second reference logs 18a, 18b). Referring also to FIG. 9, first and second warped distance profiles 53a, 53b are shown with reference to the start time $t_{start}$ and end time $t_{end}$ of a common time-frame which is independent of either the first or second time series. In FIGS. 7 to 9, the number of visualisation guides 52 shown has been varied in order to maintain a reasonable separation between adjacent visualisation guides 52. In the example shown in FIGS. 6 to 9, the periods when the ship 22 is arriving or departing are translated and expanded. By contrast, the period of cruising at substantially constant speed has been compressed for the first power output profile 54a and expanded for the second power output profile 54b.

The warped sensor logs 19a, 19b, for example warped power output profiles 54a, 54b, are output (step S5) and stored in the database 12 and/or displayed via the user interface 20 (step S6). Optionally, the warped reference logs (not shown), for example warped distance profiles 53a, 53b, may be output and stored in the database 12 and/or displayed via the user interface 20.

In this way, sensor logs 19 which are initially not directly comparable, because they correspond to unaligned time series, may be transformed to a common time-frame without any requirement to be able to identify or understand the values in the sensor logs 19. This can be useful for machines 3 or assemblages of several interrelated machines 3 which operate dynamically, rather than statically or quasi-statically, e.g., in steady state. Parameters indicating the internal state of such machines may vary in unpredictable fashions depending on what task the machine is performing. Understanding the behaviour of such parameters and establishing what constitutes average or "normal" values is useful not only for diagnosing and repairing technical faults or underperformance of the machine 3, but also for designing improvements to a machine.

Furthermore, application of dynamic time warping algorithms to sensor logs 17 directly may be difficult or impossible because they may include periods of differing behaviour as well as periods of common behaviour. For example, referring in particular to FIG. 6, the first power output profile 50a includes a number of sharply rising and falling segments or spikes 55 which are not replicated in the second power output profile 50b. Application of dynamic time warping directly to the power output profiles 50a, 50b could result in poor results because the profiles include features which are not in common. Referring in particular to FIG. 9, by transforming the power output profiles 50a, 50b by reference to the distance profiles 51a, 51b, warped power output profiles 54a, 54b are obtained which may be usefully compared. For example, it may be observed that the peaks of power output, and the spikes 55, correspond to the arrival and departure of the ship, e.g., to actions of accelerating, decelerating and manoeuvring.

In the first method, each of the first and second sensor logs 17a, 17b, may include two or more series of measured values, each series of measured values according to the respective first or second time series. For example, the first sensor log 17a may take the form of a table in which the rows correspond to points of the time series $t^a_1, t^a_2, \ldots, t^a_n, \ldots, t^a_N$ and each column corresponds to measured values from a particular sensor 6, 8. The second sensor log 17b may be similarly configured.

Each of the first and second reference logs 18a, 18b, may include two or more series of measured values, each series of measured values according to the respective first or second time series. For example, the first reference log 18a may take the form of a table in which the rows correspond to points of the time series $t^a_1, t^a_2, \ldots, t^a_n, \ldots, t^a_N$ and each column corresponds to measured values from a particular sensor 6, 8. The second reference log 18b may be similarly configured.

The first and second transformations $T_a$, $T_b$ may be determined in dependence upon sub-periods defined by the sub-period recognition module 14. The sub-period recognition module 14 may divide the first time series into a plurality of sub-periods in dependence upon the first reference log 18a. The sub-period recognition module 14 may divide the second time series into a plurality of sub-periods in dependence upon the second reference log 18b.

The first time series and the second time series may be divided into an equal number of sub-periods. The first time series and the second time series may be divided into an unequal number of sub-periods. The sub-period recognition module 14 may assign a type to each sub-period, the type determined in dependence upon the corresponding first or second reference log 18a, 18b. For example, if a reference log 18 for a ship 22 included measured values of distance and velocity, then the reference log 18 may be divided in a plurality of sub-periods having types such as, for example, "idle" sub-periods, "manoeuvring" sub-periods, "accelerating" sub-periods, "cruising" sub-periods and so forth. The transformations $T_a$, $T_b$ may be determined based on groups of consecutive sub-periods having the same type being expanded or contracted in time to span a specific interval of the common time-frame.

It shall be apparent that the first method is equally applicable to non-road mobile machines 24 or any other machines 3 incorporating sensors 6, 8.

Second Method

The division of first and second time series into sub-periods, and the assignment of sub-period types, may allow more complex transformations to be applied to sensor logs 17.

In the example shown in FIGS. 6 to 9, the first and second power output profiles 50a, 50b and distance profiles 51a, 51b corresponded to ship voyages. For machines 3 which may display greater variability during use, for example non-road mobile machine 24, the second method may be used to transform the sensor logs 17a, 17b by warping and by re-arrangement of sub-periods.

Figure 10:
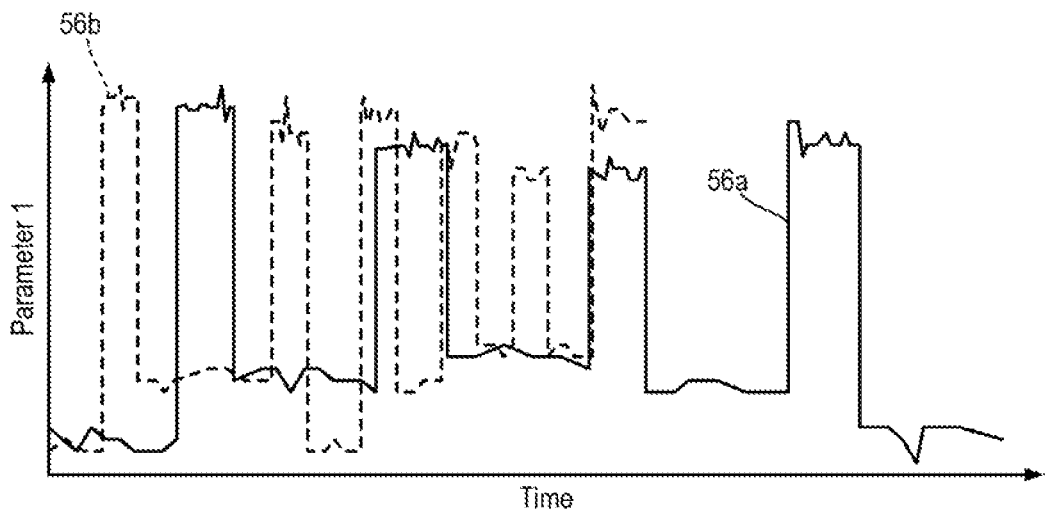
FIG. 10 illustrates examples of first and second sensor logs.

For example, referring also to FIG. 10, first and second sensor parameter profiles 56a, 56b may be unsuited to dynamic time warping because the second sensor value profile 56b includes six regions of elevated signal, compared to four regions for the first sensor value profile 56a. The first and second sensor parameter profiles 56a, 56b correspond to measured values of a first parameter. From such data, it is difficult to determine what the "normal" or baseline values of the first parameter should be for the corresponding machines, especially if the behaviour and meaning of the first parameter is not already known.

Figure 11:
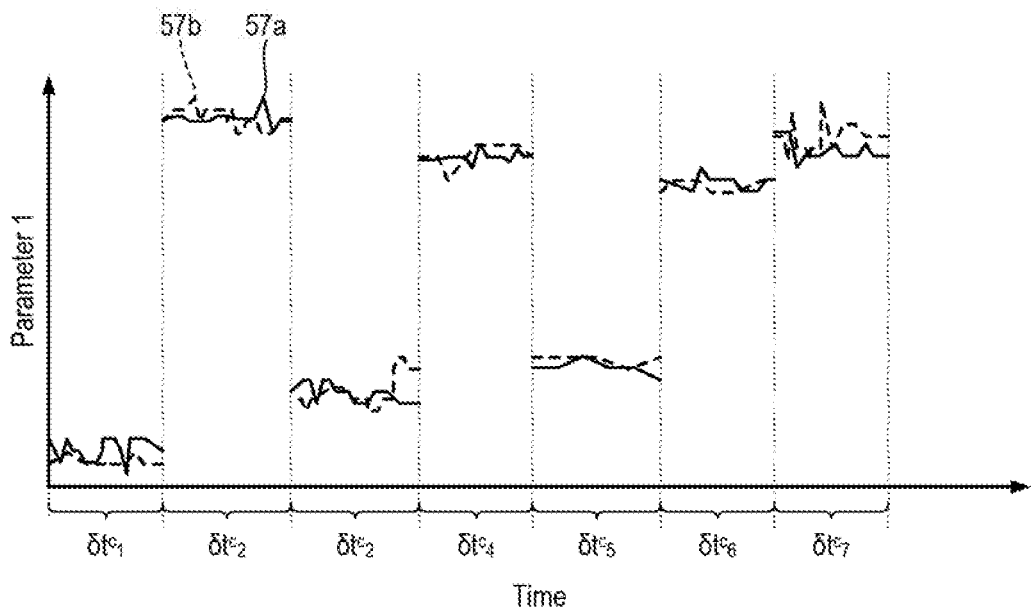
FIG. 11 illustrates the output of processing the first and second logs shown in FIG. 10 according to a different performance of the first method of processing sensor logs according to embodiments of this specification.
Figure 12:
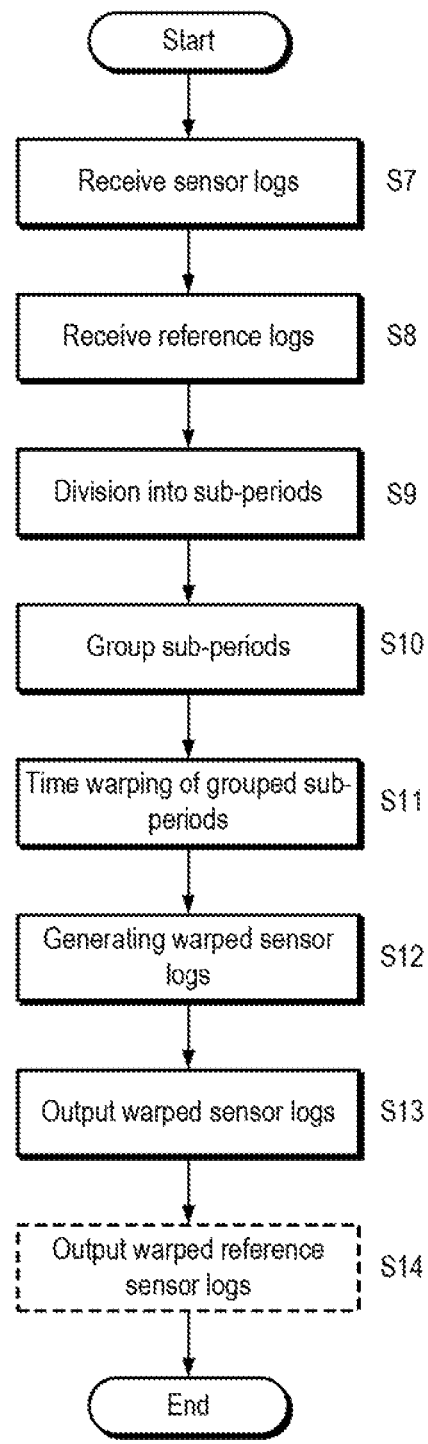
FIG. 12 is a process flow diagram of a second method of processing sensor logs.

Referring also to FIGS. 11 and 12 a second method of processing sensor logs may be used to transform the first and second sensor parameter profiles 56a, 56b into first and second warped parameter profiles 57a, 57b. The first and second warped profiles 57a, 57b may be readily compared, and two or more warped profiles 57a, 57b averaged to determine baseline behaviours. As shall become apparent hereinafter, the second method may be applied to any set of first and second sensor logs 17a, 17b and first and second reference logs 18a, 18b in order to obtain corresponding warped sensor logs 19a, 19b.

Similarly to the first method, the sensor log warping module 13 accesses first and second sensor logs 17a, 17b and first and second reference logs 18a, 18b via communication interface 11 (steps S7, S8 corresponding to steps S1, S2).

The sub-period recognition module 14 divides the first and second time series into a plurality of sub-periods in dependence upon the first and second reference logs 18a, 18b (step S9).

Figure 13:
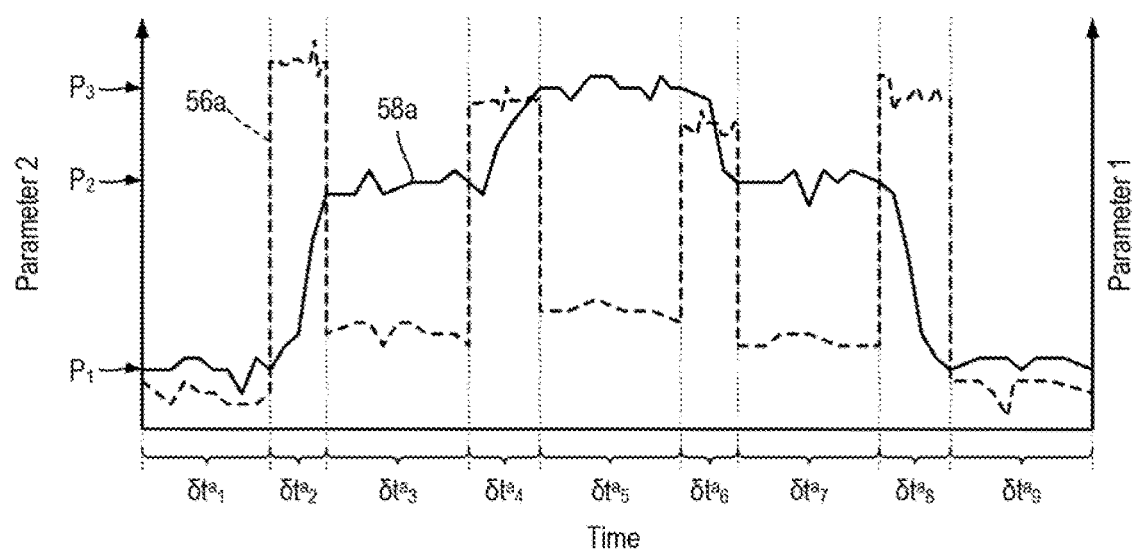
FIG. 13 illustrates dividing an example of a first reference log into a number of sub-periods according to embodiments of this specification.

For example, referring also to FIG. 13, a first reference parameter profile 58a is shown. The first reference parameter profile 58a corresponds to measured values of a second parameter. The first sensor parameter profile 56a is shown in FIG. 13 for reference.

The second parameter may be understood to correspond to one of three possible steady state operations of the corresponding machine 3. The three possible steady state operations may correspond to values of the second parameter within a tolerance of corresponding to first, second and third steady state parameter values $P_1$, $P_2$, $P_3$. The sub-period recognition module 14 may be preconfigured to recognise sub-periods corresponding to each steady state operation. The sub-period recognition module 14 determines two sub-periods $\delta t^a_1$, $\delta t^a_9$ as a first steady state type, two sub-periods $\delta t^a_3$, $\delta t^a_7$ as a second steady state type and a sub-period $\delta t^a_5$ as a third steady state type.

It may be understood that, in the example described with reference to FIG. 13, the machine 3 can only transition between adjacent operation modes, for example, the machine 3 may only transition between first and second modes or between second and third modes, and not transition directly between first and third modes. The sub-period recognition module 14 may be preconfigured with this information, and may determine a sub-period $\delta t^a_2$ as a first-to-second transition type, a sub-period $\delta t^a_4$ as a second-to-third transition type, a sub-period $\delta t^a_6$ as a third-to-second period $\delta t^a_6$ and a sub-period $\delta t^a_8$ as a second to first transition type.

Figure 16:
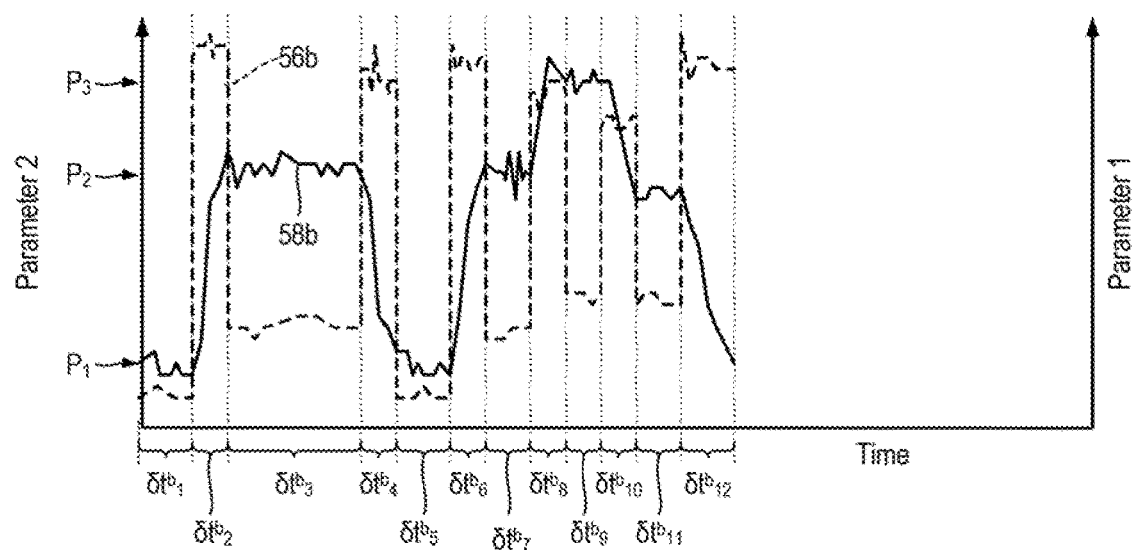
FIG. 16 illustrates dividing an example of a second reference log into a number of sub-periods according to embodiments of this specification.

Referring also to FIG. 16, a second reference parameter profile 58b is shown. The second reference parameter profile 58b corresponds to measured values of a second parameter. The second sensor parameter profile 56b is shown in FIG. 16 for reference. Similarly to the first reference parameter profile 58a, the sub-period recognition module 14 determines two sub-periods $\delta t^b_1$, $\delta t^b_5$ as a first steady state type, three sub-periods $\delta t^b_3$, $\delta t^b_7$, $\delta t^b_{11}$ as a second steady state type, and a sub-period $\delta t^b_9$ as a third steady state type. The sub-period recognition module 14 determines two sub-periods $\delta t^b_2$, $\delta t^b_6$ as a first-to-second transition type, a sub-period $\delta t^b_8$ as a second-to-third transition type, a sub-period $\delta t^b_{10}$ as a third-to-second transition type and a sub-period $\delta t^b_{12}$ as a second-to-first transition type.

Sub-periods having the same type are grouped or aggregated (step S10). Aggregating sub-periods of the same type may comprise arranging the sub-periods of that type consecutively.

Figure 14:
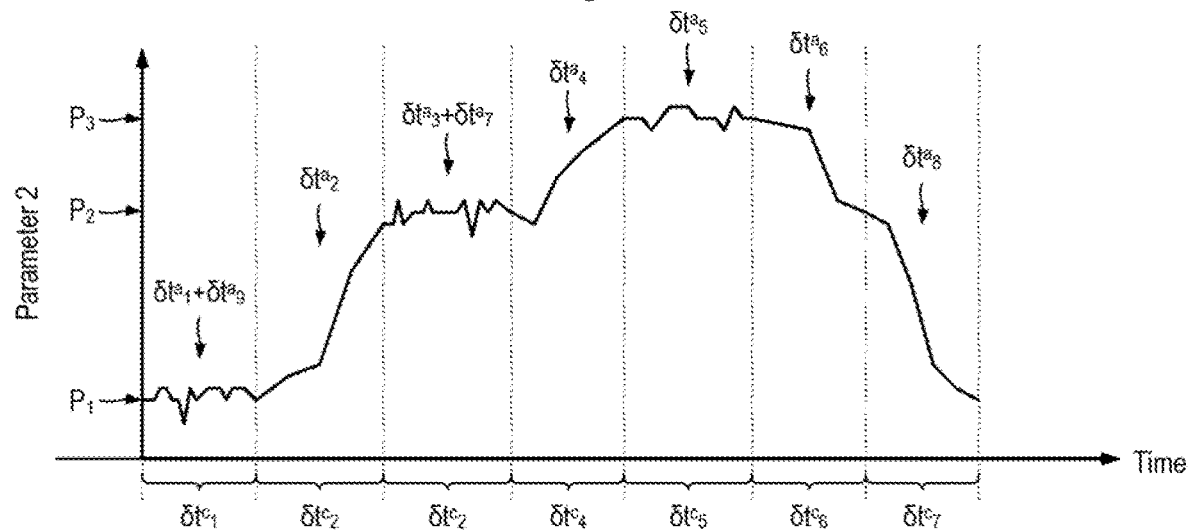
FIG. 14 illustrates transforming the example of a first reference log shown in FIG. 13 to a common time-frame according to embodiments of this specification.
Figure 17:
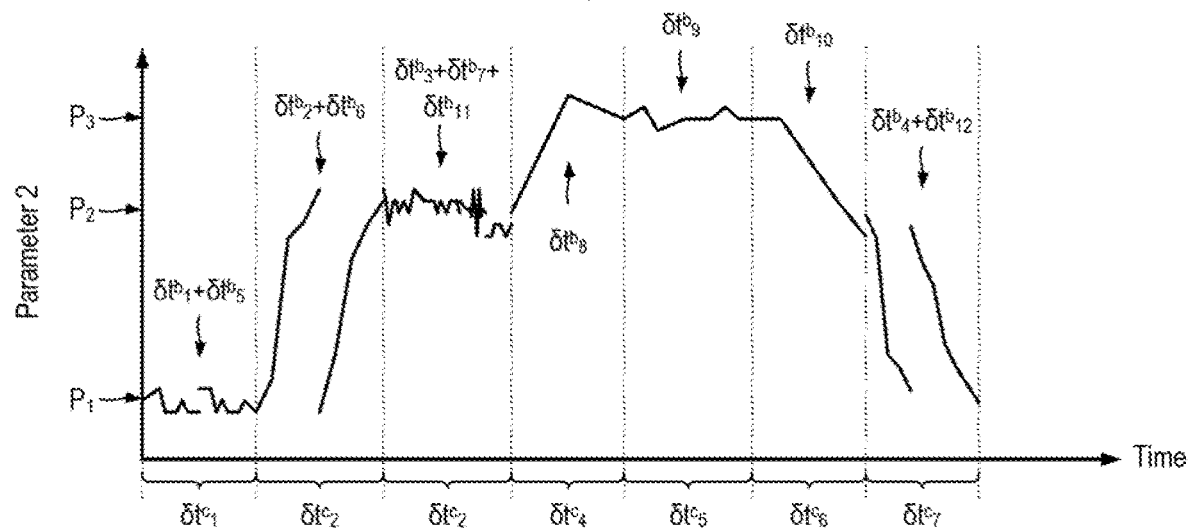
FIG. 17 illustrates transforming the example of a second reference log shown in FIG. 16 to a common time-frame according to embodiments of this specification.

For example, referring also to FIGS. 14 and 17, the sensor log warping module 13 may arrange the sub-periods in the type order: first steady state; first-to-second transition; second steady state, second-to-third transition, third steady state, third-to-second transition and second-to-first transition. The sub-periods of the first reference parameter profile 58a are aggregated and arranged as $\delta t^a_1+\delta t^a_9$, $\delta t^a_2$, $\delta t^a_3+\delta t^a_7$, $\delta t^a_4$, $\delta t^a_5$, $\delta t^a_6$ and $\delta t^a_8$. The sub-periods of the second reference parameter profile 58b are aggregated and arranged as $\delta t^b_1+\delta t^b_5$, $\delta t^b_2+\delta t^b_6$, $\delta t^b_3+\delta t^b_7+\delta t^b_{11}$, $\delta t^b_8$, $\delta t^b_9$, $\delta t^b_{10}$, $\delta t^b_4+\delta t^b_{12}$.

The grouped sub-periods of each type are set to correspond to a predetermined interval of the common time series (step S11). The grouped sub-periods of each type may be set to correspond to an interval of the common time series by expanding or compressing the corresponding time series.

For example, first to seventh common intervals $\delta t^c_1$, $\delta t^c_2$, $\delta t^c_3$, $\delta t^c_4$, $\delta t^c_5$, $\delta t^c_6$, $\delta t^c_7$ are arranged consecutively between the start time $t_{start}$ and the end time $t_{end}$ of the common time series. Sub-periods $\delta t^a_1+\delta t^a_9$ of the first reference parameter profile 58a are set to span a first common interval $\delta t^c_1$, sub-period $\delta t^a_2$ is set to span a second common interval $\delta t^c_2$, sub-periods $\delta t^a_3+\delta t^a_7$ are set to span a third common interval $\delta t^c_3$, sub-period $\delta t^a_4$ is set to span a fourth common interval $\delta t^c_4$, sub-period $\delta t^a_5$ is set to span a fifth common interval $\delta t^c_5$, sub-period $\delta t^a_6$ is set to span a sixth common interval $\delta t^c_6$, and sub-period $\delta t^a_8$ is set to span a seventh common interval $\delta t^c_7$. The mapping between the sub-periods of the first reference parameter profile 58a and the common intervals $\delta t^c_1$, $\delta t^c_2$, $\delta t^c_3$, $\delta t^c_4$, $\delta t^c_5$, $\delta t^c_6$, $\delta t^c_7$ defines a first transformation $T_a$.

Similarly, sub-periods $\delta t^b_1+\delta t^b_5$ of the second reference parameter profile 58b are set to span the first common interval $\delta t^c_1$, sub-periods $\delta t^b_2+\delta t^b_6$ are set to span the second common interval $\delta t^c_2$, sub-periods $\delta t^b_3+\delta t^b_7+\delta t^b_{11}$ are set to span the third common interval $\delta t^c_3$, sub-period $\delta t^b_8$ is set to span the fourth common interval $\delta t^c_4$, sub-period $\delta t^b_9$ is set to span the fifth common interval $\delta t^c_5$, sub-period $\delta t^b_{10}$ is set to span the sixth common interval $\delta t^c_6$, and sub-periods $\delta t^b_4+\delta t^b_{12}$ are set to span the seventh common interval $\delta t^c_7$. The mapping between the sub-periods of the second reference parameter profile 58b and the common intervals $\delta t^c_1$, $\delta t^c_2$, $\delta t^c_3$, $\delta t^c_4$, $\delta t^c_5$, $\delta t^c_6$, $\delta t^c_7$ defines a second transformation $T_b$.

The first and second warped sensor logs 19a, 19b are generated by application of the first and second transformations $T_a$, $T_b$ to the first and second sensor logs 17a, 17b in substantially the same way as the first method (step S12, corresponding to step S4). The warped sensor logs 19a, 19b are output in substantially the same way as the first method (step S13, corresponding to step S5). Optionally, the warped reference logs may be output in the same way as the first method (step S14, corresponding to step S6).

Figure 15:
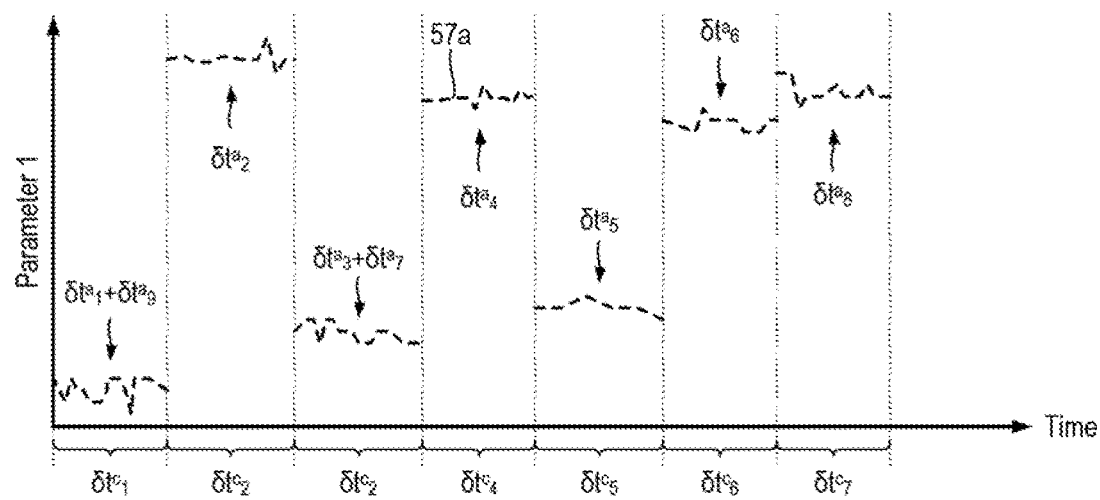
FIG. 15 illustrates transforming the example of a first sensor log shown in FIG. 10 to a common time-frame according to embodiments of this specification.
Figure 18:
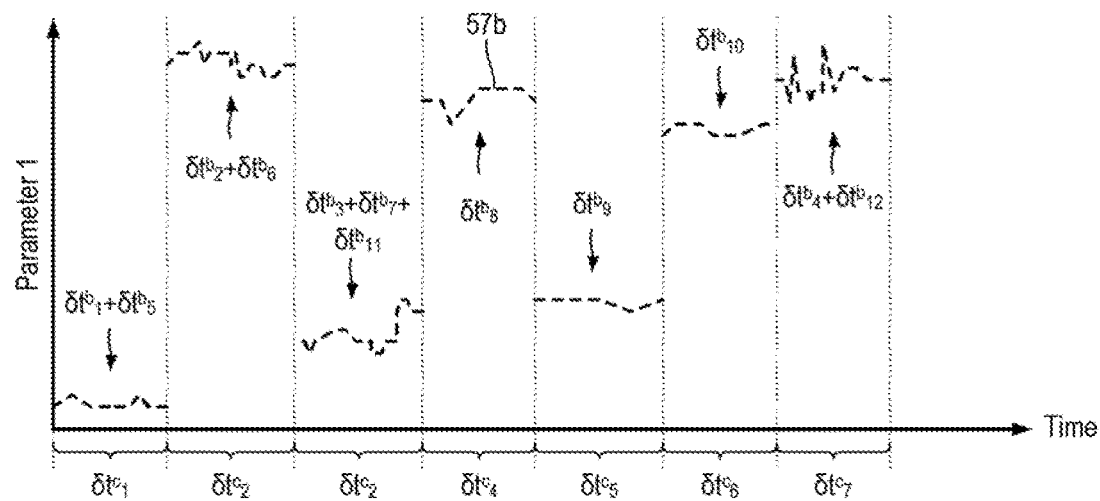
FIG. 18 illustrates transforming the example of a second sensor log shown in FIG. 10 to a common time-frame according to embodiments of this specification.

For example, referring also to FIG. 15, the first warped parameter profile 57a is generated by dividing the first sensor parameter profile 56a into sub-periods $\delta t^a_1, \ldots, \delta t^a_9$, and aggregating and arranging these sub-periods with respect to the common intervals $\delta t^c_1, \ldots, \delta t^c_7$ in the same way as for the first reference parameter profile 58a. Similarly, referring also to FIG. 18, the second warped parameter profile 57b is generated by dividing the second sensor parameter profile 56b into sub-periods $\delta t^b_1, \ldots, \delta t^b_9$, and aggregating and arranging these sub-periods with respect to the common intervals $\delta t^c_1, \ldots, \delta t^c_7$ in the same way as for the second reference parameter profile 58b.

Aggregating sub-periods of the same type need not comprise arranging the sub-periods of that type consecutively. Instead, aggregating sub-periods of the same type may comprise setting each sub-period of that type to correspond to a predetermined interval of common time, and calculating, based on the sub-periods of the same type, a single value for each time within the predetermined interval of common time. In some embodiments, calculating a single value for each common time may include obtaining an average across each sub-period of the same type. In some embodiments, calculating a single value for each common time may include merging the sub-periods of the same type and calculating an average for any common time corresponding to two or more values. In some embodiments, calculating a single value for each common time may include fitting an interpolating function based on the sub-periods of the same type.

For example, instead of setting sub-periods $\delta t^a_1 + \delta t^a_9$ to span the first common interval $\delta t^c_1$, sub-periods $\delta t^a_1$ and $\delta t^a_9$ may each be set to span the first common period and then averaged to produce a single averaged profile through the first common interval $\delta t^c_1$.

The second method has been described with reference to examples of reference logs 18a, 18b which correspond to three possible steady state operations, namely values of the second parameter within a tolerance of corresponding first, second and third steady state parameter values $P_1, P_2, P_3$ and transitions only between adjacent operation modes. However, it will be appreciated that the second method is applicable to any set of sensor logs 17a, 17b, and reference logs 18a, 18b in which pattern recognition may be performed using values in the reference logs 18a, 18b. For example, in relation to a machine 3 in the form of a non-road mobile machine 24, the reference logs 18a, 18b may include time series of measured values of position, speed and acceleration and sub-periods may be defined corresponding to starting the engine, idling, accelerating, braking, coasting and so forth.

It shall be apparent that the second method is equally applicable to ships 22, non-road mobile machine 24, or any other machines 3 incorporating sensors 6, 8. In general, the first method and the second method may be used either alone or in combination.

Determining Baseline Parameters

Figure 19:
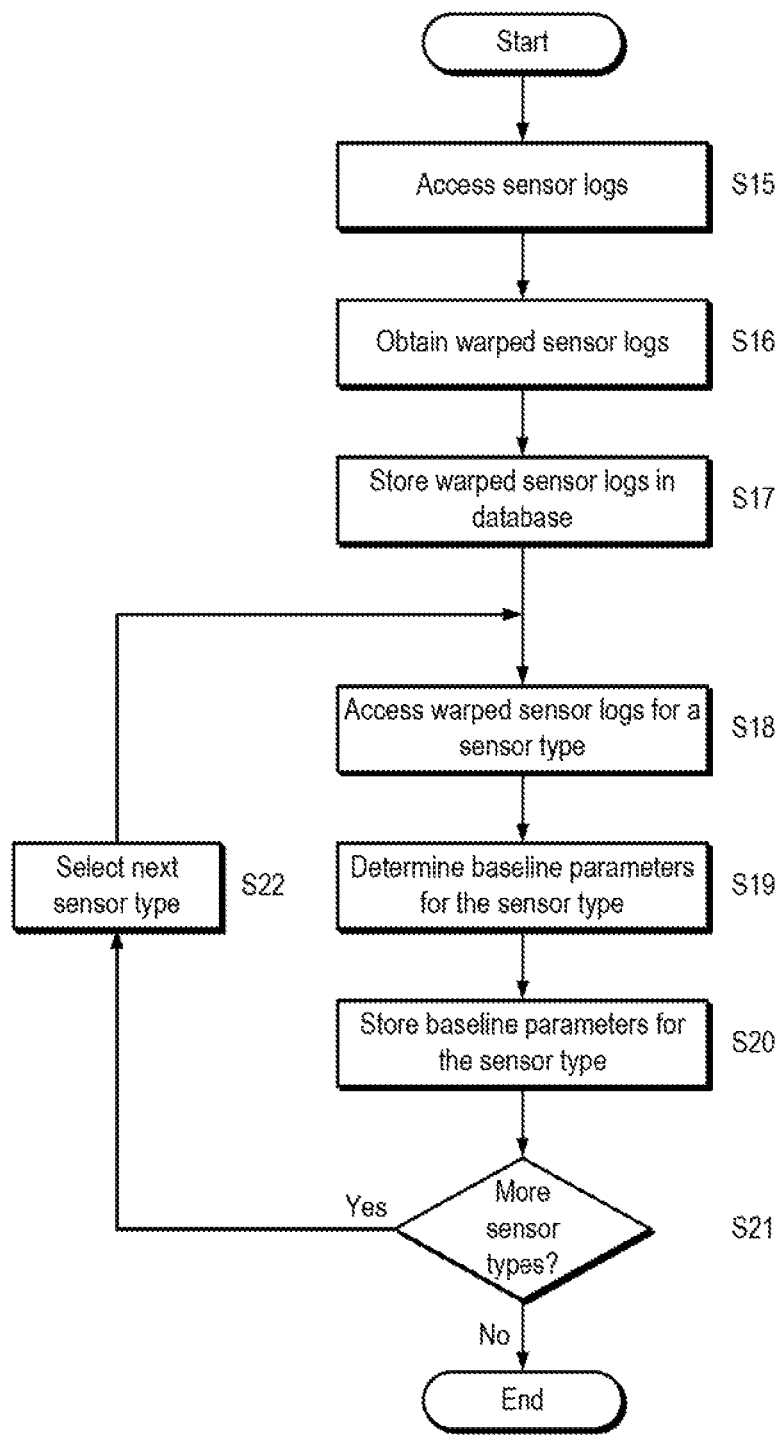
FIG. 19 is a process flow diagram of a method of determining baseline parameters for one or more machines according to embodiments of this specification.

Referring also to FIG. 19, a method of determining baseline parameters for one or more machines 3 is described.

A number of sensor logs 17 and the corresponding reference logs 18 are accessed (step S15). The sensor logs 17 and reference logs 18 may be received via the communication interface 11 or previously received sensor logs 17 and reference logs 18 may be retrieved from the database 12. Some sensor logs 17 and reference logs 18 may be received via the communication interface 11 and other sensor logs 17 and reference logs 18 may be retrieved from the database 12. The number of sensor logs 17 and corresponding reference logs 18 may be large, for example more than one thousand, more than ten thousand or more than one hundred thousand.

The sensor logs 17 are all transformed to a single, common time-frame using the first or second methods (step S16), and the resulting warped sensor logs 19 are stored to the database (step S17).

The baseline extraction module 15 accesses the warped sensor logs 19 corresponding to sensors 6, 8 having a certain type (step S18). For example, when the machine 3 is a non-road mobile machine 24 including an engine 27, the baseline extraction module 15 may access all warped sensor logs 19 corresponding to pressure sensors 6 which measure fuel injection pressure in a fuel injector sub-system 5. As another example, when the machine 3 is a ship 22, the baseline extraction module 15 may access all warped sensor logs 19 corresponding to temperature sensors 6 which measure engine temperature. Alternatively, when the machine 3 is a non-road mobile machine, the baseline extraction module 15 may access all warped sensor logs 19 corresponding to an oxygen sensor 30 in the engine 27.

The baseline extraction module 15 calculates, using the measured values of a parameter at each time point within the common time-frame, i.e. between $t_{start}$ and $t_{end}$, an average or expected value for the parameter measured by the corresponding sensor 6, 8 (step S19). In some embodiments, calculating an average parameter value for each common time may include taking a mean average. In some embodiments, calculating an expected value for each common time may include fitting an interpolating function to the measured values from all the warped sensor logs 19. Alternatively, for some sensors 6, 8, the measured values of a parameter may not vary substantially over time. For such sensors, simple time series statistics may be applied to derive baseline parameters 21 in the form of a mean value, standard deviation, minimum and maximum values for the corresponding sensor 6, 8.

The baseline parameters 21 obtained, for example in the form of an average or expectation value at each time point within the common time-frame, are stored to the database 12 (step S20). If there are further sensor types (step S21; Yes), then the next sensor 6, 8 type is selected (step S22) and the corresponding baseline parameters 21 are obtained and stored to the database 12 (steps S18 to S20). Once baseline parameters 21 corresponding to all warped sensor logs 19 and all types of sensor 6, 8 have been determined (step S21; No), the process finishes.

In this way, the database 12 is populated with baseline parameters 21 corresponding to each sensor 6, 8 of the machine 3 or machines 3.

Evaluation of Machine Operations

Using the database 12 including the baseline parameters 21 determined as described hereinbefore, further sensor logs 17 obtained from a machine 3 may be compared against the stored baseline parameters 21 in order to identify anomalies such as faults or degraded performance.

Figure 20:
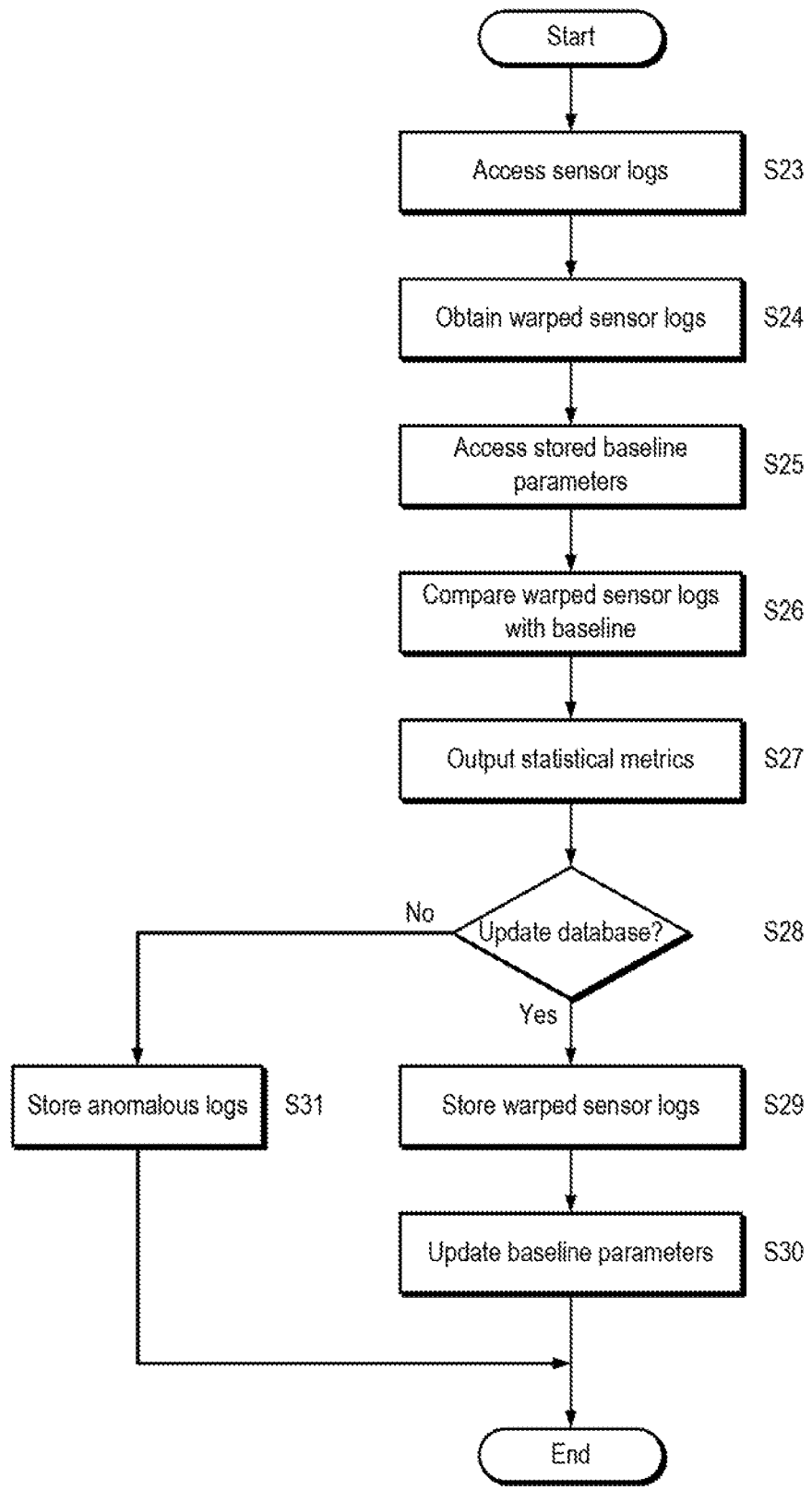
FIG. 20 is a process flow diagram of a method of evaluating the operation of a machine according to embodiments of this specification.

Referring also to FIG. 20, new sensor logs 17, e.g., sensor logs which have not been included in determining baseline parameters 21, are accessed via the communications interface 11 (step S23). The new sensor logs 17 may be received via the communications interface 11 and network links 4. In another example, the new sensor logs 17 may have been received previously and stored in the database 12. New sensor logs 17 may be received and temporarily stored for subsequent batch processing, for example when a certain number of new sensor logs 17 have been received or according to a schedule.

Warped sensor logs 19 corresponding to the new sensor logs 17 are obtained by the sensor log warping module 13 using the first or second methods (step S24). The baseline parameters 21 for the types of sensor 6, 8 corresponding to the new sensor logs 17 are accessed and retrieved from the database 12 (step S25). The measured values contained in the warped sensor logs 19 corresponding to the new sensor logs 17 are compared to the stored baseline parameters 21 and statistical metrics are determined by the baseline comparison module (step S26).

Figure 21:
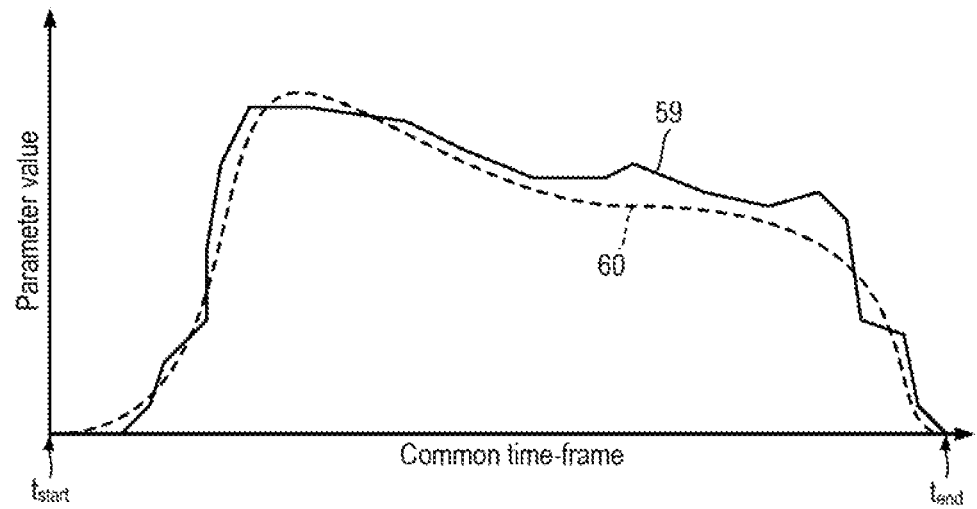
FIGS. 21 and 22 illustrate statistical metrics for the purposed of evaluating the operation of a machine according to embodiments of this specification.

For example, referring also to FIG. 21, where the values of a parameter measured by a sensor 6, 8 vary with time, the parameter values may be plotted against time as a parameter profile 59. A corresponding baseline parameter 21 may include an average or expected parameter profile 60 as a function of time within the common time-frame, $t_{start}$ to $t_{end}$. The average or expected parameter profile 60 may have been obtained aggregating a large number of sensor logs 17 across a number of different machines 3 and/or repeated operations of a number of machines 3, for example by aggregating data from multiple voyages, journeys or working days of a ship 22 or non-road mobile machine 24. The baseline parameters 21 may also include a standard deviation, a minimum and/or a maximum value of the measured parameter as a function of time within the common time-frame. The baseline comparison module 16 may be configured to determine statistical metrics such as, for example, the mean and standard deviation of the difference between the parameter profile 59 and the average or expected parameter profile 60. Minimum and maximum differences may also be used as statistical metrics. In this way, anomalous measurements from a sensor 6, 8 may be detected because, for example, the parameter curve profile 59 deviates from an average or expected parameter profile 60 by more than a common-time dependent standard deviation.

Figure 22:
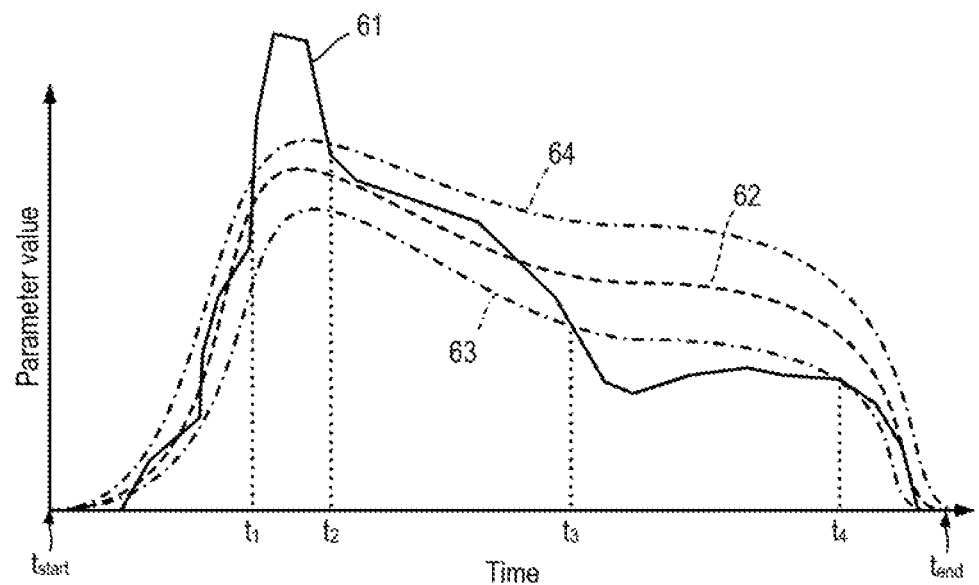

Referring also to FIG. 22, the baseline comparison module 16 may be configured to determine additional statistical metrics. For example, the number and duration of intervals during which a parameter profile 61 differs from an average or expected parameter profile 62 by more than a threshold amount may be calculated and used as a metric. For example, the number and duration of intervals during which the parameter profile 61 lies below a 25th percentile 63 or above a 75th percentile 64 may be recorded. In the example shown in FIG. 22, the parameter profile 61 exceeds the 75th percentile 64 for a first interval $t_2$-$t_1$ and dips below the 25th percentile 63 for a second interval $t_4$-$t_3$. A Schmidt trigger may be used, for example at the 75th and 80th percentiles, to determine that the parameter profile 61 has exceeded a specified tolerance.

The baseline comparison module 16 outputs the determined statistical metrics to a user interface 20 (step S27).

A decision is made as to whether to update the stored baseline parameters 21 to include the warped sensor logs 19 corresponding to the new sensor logs 17 (step S28). The decision can be automatic, for example, if the baseline comparison module 16 determines that the warped sensor logs 19 corresponding to the new sensor logs 17 are within threshold tolerances of the baseline parameters 21 (step S28; Yes), the new sensor logs 17 are stored in the database 12 (step S29) and the baseline extraction module 15 re-calculates or updates baseline parameters 21 as described with reference to FIG. 19 (step S30). For many baseline parameters 21, complete re-calculation will be unnecessary, for example, a mean value may be updated to include new values using appropriate weightings.

If the baseline comparison module 16 determines that the warped sensor logs 19 corresponding to the new sensor logs 17 are not within threshold tolerances of the baseline parameters 21 (step S28; No), the new sensor logs 17 are stored in the database 12 as anomalous logs (step S31), and the baseline parameters 21 are not updated or recalculated. In this way, the baseline parameters 21 may be prevented from being influenced by anomalous behaviour.

In other examples, the decision whether to update the database 12 may be received from the user interface 20 based on an engineer or mechanics assessment of the statistical metrics. In other examples, the baseline parameters 21 stored in the database 12 may be "read only" such that the baseline parameters 21 are not updated in use. In still further examples, the baseline parameters 21 may be automatically updated to include new values, regardless of whether or not the new values are within threshold tolerances of the baseline parameters 21.

Modifications

It will be appreciated that many modifications may be made to the embodiments hereinbefore described. Such modifications may involve equivalent and other features which are already known in automated monitoring and control of machinery, and which may be used instead of or in addition to features already described herein. Features of one embodiment may be replaced or supplemented by features of another embodiment.

Although claims have been formulated in this application to particular combinations of features, it should be understood that the scope of the disclosure of the present disclosure also includes any novel features or any novel combination of features disclosed herein either explicitly or implicitly or any generalization thereof, whether or not it relates to the same disclosure as presently claimed in any claim and whether or not it mitigates any or all of the same technical problems as does the present disclosure.

The invention claimed is:

1. A computer-implemented method of processing sensor logs, wherein the method is performed using one or more processors or dedicated hardware, the method comprising:
   accessing a first sensor log and a corresponding first reference log, each of the first sensor log and the first reference log comprising a first series of measured values of a first parameter and a second parameter according to a first time series;
   accessing a second sensor log and a corresponding second reference log, each of the second sensor log and the second reference log comprising a series of measured values of the first parameter and the second parameter according to a second time series;
   dynamically time warping the first reference log and the second reference log to transform each of the first and the second reference logs to a common time-frame, wherein dynamically time warping the first and second reference logs comprises:
      dividing the first time series into a plurality of sub-periods in dependence upon the first reference log;
      dividing the second time series into a plurality of sub-periods in dependence upon the second reference log, wherein the sub-periods of the first time series and the second time series are consecutive and non-overlapping;
   determining, based on the dynamically time warping the first and second reference logs, a first transformation between the first time series and the common time-frame;
   determining, based on the dynamically time warping the first and second reference logs, a second transformation between the second time series and the common time-frame;

generating a first warped sensor log by applying the first transformation to the first sensor log;

generating a second warped sensor log by applying the second transformation to the second sensor log; and causing a presentation of a user interface, the user interface including a representation of at least a first section of the first warped sensor log and at least one corresponding second section of the second warped sensor log.

2. The method of claim 1, wherein the first time series and the second time series are divided into an equal number of sub-periods.

3. The method of claim 1, wherein each sub-period has a type determined in dependence upon the corresponding first or second reference log.

4. The method of claim 1, wherein dynamically time warping of the first and second reference logs further comprises:

for each of the first and second reference logs:
   aggregating sub-periods of the same type;
     arranging aggregated sub-periods in dependence upon sub-period type; and
     setting each type of sub-period to correspond to an interval of the common time-frame.

5. The method of claim 4, wherein aggregating sub-periods of the same type comprises arranging the sub-periods of that type consecutively.

6. The method of claim 4, wherein aggregating sub-periods of the same type comprises:

setting each sub-period of that type to correspond to the same interval of the common time-frame; and calculating, based on the sub-periods of the same type, a single value for each time within the interval of the common time-frame.

7. The method of claim 6, further comprising:

accessing a plurality of sensor logs and a corresponding plurality of reference logs, each sensor log and reference log comprising a series of measured values of a parameter according to a time series, each sensor log corresponding to a sensor type;

transforming the plurality of sensor logs to a single common time-frame by dynamic time warping and for each sensor type:
   providing a baseline sensor log by determining and storing a series of averaged values according to a common time series spanning the common time-frame.

8. A system for processing sensor logs, the system comprising:

one or more processors;

memory storing instructions that, when executed by the one or more processors, cause the system to perform:

accessing a first sensor log and a corresponding first reference log, each of the first sensor log and the first reference log comprising a first series of measured values of a first parameter and a second parameter according to a first time series;

accessing a second sensor log and a corresponding second reference log, each of the second sensor log and the second reference log comprising a series of measured values of the first parameter and the second parameter according to a second time series;

dynamically time warping the first reference log and the second reference log to transform each of the first and the second reference logs to a common time-frame, wherein dynamically time warping the first and second reference logs comprises:

dividing the first time series into a plurality of sub-periods in dependence upon the first reference log;

dividing the second time series into a plurality of sub-periods in dependence upon the second reference log, wherein the sub-periods of the first time series and the second time series are consecutive and non-overlapping;

determining, based on the dynamically time warping the first and second reference logs, a first transformation between the first time series and the common time-frame;

determining, based on the dynamically time warping the first and second reference logs, a second transformation between the second time series and the common time-frame;

generating a first warped sensor log by applying the first transformation to the first sensor log;

generating a second warped sensor log by applying the second transformation to the second sensor log; and causing a presentation of a user interface, the user interface including a representation of at least a first section of the first warped sensor log and at least one corresponding second section of the second warped sensor log.

9. The system of claim 8, wherein the first time series and the second time series are divided into an equal number of sub-periods.

10. The system of claim 8, wherein each sub-period has a type determined in dependence upon the corresponding first or second reference log.

11. The system of claim 8, wherein dynamically time warping of the first and second reference logs further comprises:

for each of the first and second reference logs:
   aggregating sub-periods of the same type;
   arranging aggregated sub-periods in dependence upon sub-period type; and
   setting each type of sub-period to correspond to an interval of the common time-frame.

12. The system of claim 11, wherein aggregating sub-periods of the same type comprises arranging the sub-periods of that type consecutively.

13. The system of claim 11, wherein aggregating sub-periods of the same type comprises:

setting each sub-period of that type to correspond to the same interval of the common time-frame; and calculating, based on the sub-periods of the same type, a single value for each time within the interval of the common time-frame.

14. The system of claim 13, wherein the instructions further cause the system to perform:

accessing a plurality of sensor logs and a corresponding plurality of reference logs, each sensor log and reference log comprising a series of measured values of a parameter according to a time series, each sensor log corresponding to a sensor type;

transforming the plurality of sensor logs to a single common time-frame by dynamic time warping and for each sensor type:
   providing a baseline sensor log by determining and storing a series of averaged values according to a common time series spanning the common time-frame.

15. A non-transitory computer-readable storage medium including instructions that, when executed by at least one processor of a computing system, cause the computing system to perform a method comprising:

accessing a first sensor log and a corresponding first reference log, each of the first sensor log and the first reference log comprising a first series of measured values of a first parameter and a second parameter according to a first time series;

accessing a second sensor log and a corresponding second reference log, each of the second sensor log and the second reference log comprising a series of measured values of the first parameter and the second parameter according to a second time series;

dynamically time warping the first reference log and the second reference log to transform each of the first and the second reference logs to a common time-frame, wherein dynamically time warping the first and second reference logs comprises:

dividing the first time series into a plurality of sub-periods in dependence upon the first reference log;

dividing the second time series into a plurality of sub-periods in dependence upon the second reference log, wherein the sub-periods of the first time series and the second time series are consecutive and non-overlapping;

determining, based on the dynamically time warping the first and second reference logs, a first transformation between the first time series and the common time-frame;

determining, based on the dynamically time warping the first and second reference logs, a second transformation between the second time series and the common time-frame;

generating a first warped sensor log by applying the first transformation to the first sensor log;

generating a second warped sensor log by applying the second transformation to the second sensor log; and causing a presentation of a user interface, the user interface including a representation of at least a first section of the first warped sensor log and at least one corresponding second section of the second warped sensor log.

16. The non-transitory computer-readable storage medium of claim 15, wherein the first time series and the second time series are divided into an equal number of sub-periods.

17. The non-transitory computer-readable storage medium of claim 15, wherein dynamically time warping of the first and second reference logs further comprises:

for each of the first and second reference logs:
aggregating sub-periods of the same type;
arranging aggregated sub-periods in dependence upon sub-period type; and
setting each type of sub-period to correspond to an interval of the common time-frame.

\* \* \* \* \*